(12) United States Patent
Peters et al.

(10) Patent No.: US 7,582,691 B2
(45) Date of Patent: Sep. 1, 2009

(54) POLY(ARYLENE ETHER) COMPOSITIONS AND ARTICLES

(75) Inventors: Edward Norman Peters, Lenox, MA (US); Christina Louise Braidwood, Niskayuna, NY (US)

(73) Assignee: Sabic Innovative Plastics IP B.V. (NL)

( * ) Notice: Subject to any disclaimer, the term of this patent is extended or adjusted under 35 U.S.C. 154(b) by 280 days.

(21) Appl. No.: 11/623,900

(22) Filed: Jan. 17, 2007

(65) Prior Publication Data
US 2008/0171817 A1     Jul. 17, 2008

(51) Int. Cl.
C08K 5/3492     (2006.01)
C08K 5/5397     (2006.01)

(52) U.S. Cl. .................. 524/100; 524/129; 524/139
(58) Field of Classification Search .......... 524/100, 524/129, 139, 140, 141
See application file for complete search history.

(56) References Cited

U.S. PATENT DOCUMENTS

| | | | |
|---|---|---|---|
| 3,018,290 A | 1/1962 | Sauters et al. | |
| 3,306,875 A | 2/1967 | Hay et al. | |
| 3,562,223 A | 2/1971 | Bargain et al. | |
| 4,211,860 A | 7/1980 | Stenzenberger | |
| 4,211,861 A | 7/1980 | Stenzenberger | |
| 4,304,705 A | 12/1981 | Heilman et al. | |
| 4,540,763 A | 9/1985 | Kirchhoff et al. | |
| 4,642,126 A | 2/1987 | Zador et al. | |
| 4,642,329 A | 2/1987 | Kirchhoff et al. | |
| 4,652,274 A | 3/1987 | Boettcher et al. | |
| 4,661,193 A | 4/1987 | Kirchhoff et al. | |
| 4,724,260 A | 2/1988 | Kirchhoff et al. | |
| 4,743,399 A | 5/1988 | Kirchhoff et al. | |
| 4,923,932 A | 5/1990 | Katayose et al. | |
| 5,218,030 A | 6/1993 | Katayose et al. | |
| 5,352,745 A | 10/1994 | Katayose et al. | |
| 5,391,650 A | 2/1995 | Brennan et al. | |
| 5,407,972 A | 4/1995 | Smith et al. | |
| 5,543,516 A | 8/1996 | Ishida | |
| 6,025,419 A | 2/2000 | Kasowski et al. | |
| 6,627,704 B2 | 9/2003 | Yeager et al. | |
| 6,689,825 B1 | 2/2004 | Bajgur et al. | |
| 6,905,693 B2 | 6/2005 | Chyall et al. | |
| 7,067,595 B2 | 6/2006 | Zarnoch et al. | |
| 7,101,923 B2 | 9/2006 | Campbell et al. | |
| 7,119,136 B2 * | 10/2006 | Campbell et al. | 524/133 |
| 7,211,639 B2 * | 5/2007 | Yeager et al. | 528/126 |
| 2003/0096123 A1 | 5/2003 | Yeager | |
| 2004/0227130 A1 | 11/2004 | Hoerold et al. | |
| 2004/0254270 A1 | 12/2004 | Harashina et al. | |
| 2005/0004292 A1 | 1/2005 | Harashina et al. | |
| 2005/0075427 A1 | 4/2005 | Campbell et al. | |
| 2006/0074154 A1 | 4/2006 | Harashina et al. | |
| 2006/0138391 A1 | 6/2006 | Drewes et al. | |
| 2006/0167142 A9 | 7/2006 | Campbell et al. | |
| 2006/0183835 A1 | 8/2006 | Hoerold et al. | |
| 2007/0080330 A1 | 4/2007 | Peters et al. | |
| 2007/0082986 A1 | 4/2007 | Peters et al. | |
| 2007/0082987 A1 | 4/2007 | Peters et al. | |

FOREIGN PATENT DOCUMENTS

| | | |
|---|---|---|
| EP | 1486536 A | 12/2004 |
| WO | WO 98/08898 A1 | 3/1998 |
| WO | 2005033179 A | 4/2005 |

OTHER PUBLICATIONS

International Search Report; International Application No. PCT/US2008/051284; International Filing Date Jan. 17, 2008; Date of Mailing Jun. 17, 2008 (5 pages).
PCT Written Opinion of the International Searching Authority; International Application No. PCT/US2008/051284; International Filing Date Jan. 17, 2008 (7 pages).
UL 94 "Tests for Flammability of Plastics Materials for Parts in Devices and Appliances"; Dec. 12, 2003; 52 pages.
Dwain M. White, "Polymerization of Oxidative Coupling. II. Co-Redistribution of Poly(2,6-diphenyl-1,4-phenylene Ether) with Phenols", Journal of Polymer Science: Part A-1, vol. 9, 663-675 (1971).
Dwain M. White, "Reactions of Poly(phenylene Oxide)s with Quinones. I. The Quinone-Coupling Reaction Between Low-Molecular Weight Poly(2,6-Dimethyl-1,4-Phenylene Oxide) and 3,3',5,5'-Tetramethyl-4,4'-Diphenoquinone", Journal of Polymer Science: Polymer Chemistry Edition, vol. 19, 1367-1383 (1981).
Ning et al., "Phenolic materials via ring-opening polymerization: Synthesis and characterization of bisphenol-A based benzoxazines and their polymers", Journal of Polymer Science Part A: Polymer Chemistry, vol. 32, Issue 6, Abstract Only (1 page), Mar. 10, 2003.
http://www.cibasc.com/melapur, printed Aug. 1, 2007 (2 pages).
Ciba® MELAPUR® Halogen-free flame retardants to protect polymers brochure; 2006; (4 pages).
Ciba® MELAPUR® 200/70 Halogen free melamine based flame retardant for glass fiber reinforced PA66; Printing date Jun. 2005; (2 pages).
Ciba® MELAPUR® MC25 Halogen free melamine based flame retardant for polyamides and TPU; Printing date Sep. 2004 (2 pages).

* cited by examiner

*Primary Examiner*—Peter Szekely
(74) *Attorney, Agent, or Firm*—Cantor Colburn LLP

(57) ABSTRACT

A curable composition includes a functionalized poly(arylene ether), a vinyl thermoset resin, and a flame retardant composition. The flame retardant composition includes a trihydrocarbylphosphine oxide and a nitrogen-containing flame retardant that may be melamine phosphate, melamine pyrophosphate, or melamine polyphosphate. The combination of the trihydrocarbylphosphine oxide and the nitrogen-containing flame retardant is particularly effective at improving the flame retardancy of the cured composition at relatively low levels of total flame retardant. A method of preparing the curable composition and articles including the cured composition are also described.

32 Claims, No Drawings

POLY(ARYLENE ETHER) COMPOSITIONS AND ARTICLES

BACKGROUND OF THE INVENTION

Thermoset resins are materials that cure to form very hard plastics. These materials can be used in a wide variety of consumer and industrial products. For example, thermosets are used in protective coatings, adhesives, electronic laminates (such as those used in the fabrication of computer circuit boards), flooring and paving applications, glass fiber-reinforced pipes, and automotive parts (including leaf springs, pumps, and electrical components). Relative to other types of plastics, cured thermosets are typically brittle. Addition of a poly(arylene ether) to a curable thermoset composition is known to decrease the brittleness of the cured resin.

For many uses, poly(arylene ether)-containing thermoset compositions must be flame retardant. For many years, halogenated flame retardants, particularly brominated flame retardants, have been added to thermoset compositions. While these halogenated flame retardants are effective, they have also been shown to bioaccumulate, and questions have been raised about their environmental and health effects. There is therefore a desire to reduce or eliminate the use of halogenated flame retardants.

Although non-halogenated flame retardants are known, many are less effective than halogenated flame retardants when compared on an equal weight basis in thermoset compositions. This means that greater amounts of the non-halogenated flame retardants must be used, and this detracts from the physical properties of the cured composition. Furthermore, some non-halogenated flame retardants, including phosphate esters, are unstable to long term use in the presence of liquid water or water vapor, and their decomposition can yield acidic products. This problem is particularly significant when the thermoset resins are used in the fabrication of printed circuit boards, because the acidic products can corrode electrical connections on the boards.

There is therefore a desire for flame retardant, poly(arylene ether)-containing thermoset compositions that avoid the use of halogenated flame retardants, exhibit high levels of flame retardancy with relatively small amounts of flame retardant additive, and avoid the generation of acidic decomposition products.

BRIEF DESCRIPTION OF THE INVENTION

One embodiment is a curable composition, comprising: a functionalized poly(arylene ether); a vinyl thermoset resin; and a flame retardant composition comprising a trihydrocarbylphosphine oxide and a nitrogen-containing flame retardant selected from the group consisting of melamine phosphate, melamine pyrophosphate, melamine polyphosphates, and mixtures thereof.

One embodiment is a curable composition, consisting of: a functionalized poly(arylene ether); a vinyl thermoset resin; and a flame retardant composition consisting of a trihydrocarbylphosphine oxide and a nitrogen-containing flame retardant; optionally, a filler; optionally, a curing initiator, a curing inhibitor, or a combination thereof; and optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof.

One embodiment is a curable composition, comprising: a capped poly(arylene ether); triallyl cyanurate, triallyl isocyanurate, or a combination thereof; and a flame retardant composition comprising triphenylphosphine oxide and melamine polyphosphate.

One embodiment is a curable composition, consisting of: a capped poly(arylene ether); triallyl cyanurate, triallyl isocyanurate, or a combination thereof; a flame retardant composition consisting of triphenylphosphine oxide and melamine polyphosphate; optionally, a filler; optionally, a curing initiator, a curing inhibitor, or a combination thereof; and optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof.

One embodiment is a curable composition, comprising: about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.; about 40 to about 90 parts by weight of triallyl isocyanurate; and about 10 to about 40 parts by weight a flame retardant composition comprising about 2 to about 38 parts by weight triphenylphosphine oxide, and about 2 to about 38 parts by weight of melamine polyphosphate; wherein all parts by weight are based on 100 parts by weight total of the methacrylate-capped poly(2,6-dimethyl-1,4-phenylene ether) resin and the triallyl isocyanurate.

One embodiment is a curable composition, consisting of: about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.; about 40 to about 90 parts by weight of triallyl isocyanurate; and about 10 to about 40 parts by weight a flame retardant composition consisting of about 2 to about 38 parts by weight triphenylphosphine oxide, and about 2 to about 38 parts by weight of melamine polyphosphate; optionally, up to 900 parts by weight of a filler; optionally, a curing initiator, a curing inhibitor, or a combination thereof; and optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the methacrylate-capped poly(2,6-dimethyl-1,4-phenylene ether) resin and the triallyl isocyanurate.

One embodiment is a curable composition, comprising: about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.; about 40 to about 90 parts by weight of triallyl isocyanurate; and about 15 to about 30 parts by weight a flame retardant composition comprising about 2 to about 28 parts by weight triphenylphosphine oxide, and about 2 to about 28 parts by weight of melamine polyphosphate; wherein all parts by weight are based on 100 parts by weight total of the methacrylate-capped poly(2,6-dimethyl-1,4-phenylene ether) resin and the triallyl isocyanurate.

One embodiment is a curable composition, consisting of: about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.; about 40 to about 90 parts by weight of triallyl isocyanurate; and about 15 to about 30 parts by weight a flame retardant composition consisting of about 2 to about 28 parts by weight triphenylphosphine oxide, and about 2 to about 28 parts by weight of melamine polyphosphate; optionally, up to 900 parts by weight of a filler; optionally, a curing initiator, a curing inhibitor, or a combination thereof; and optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the methacrylate-capped poly(2,6-dimethyl-1,4-phenylene ether) resin and the triallyl isocyanurate.

One embodiment is a method of preparing a curable composition, comprising: blending a functionalized poly(arylene ether), a vinyl thermoset resin, and a flame retardant composition comprising a trihydrocarbylphosphine oxide and a nitrogen-containing flame retardant selected from the group consisting of melamine phosphate, melamine pyrophosphate, melamine polyphosphates, and mixtures thereof.

Other embodiments, including cured compositions obtained on curing the curable compositions and articles comprising the cured compositions, are described in detail below.

DETAILED DESCRIPTION OF THE INVENTION

The present inventors have conducted experiments in search of flame-retardant poly(arylene ether)-containing thermoset compositions that avoid the use of halogenated flame retardants, exhibit high levels of flame retardancy with relatively small amounts of flame retardant additive, and avoid the generation of acidic decomposition products. Particularly effective flame retardant properties were observed for the combination of a trihydrocarbylphosphine oxide and a nitrogen-containing flame retardant selected from the group consisting of melamine phosphate, melamine pyrophosphate, melamine polyphosphates, and mixtures thereof. The efficacy of this combination was unexpected given the substantially inferior performance of combinations of a trihydrocarbylphosphine oxide and other melamine-based flame retardants, such as melamine cyanurate.

One embodiment is a curable composition, comprising: a functionalized poly(arylene ether); a vinyl thermoset resin; and a flame retardant composition comprising a trihydrocarbylphosphine oxide and a nitrogen-containing flame retardant selected from the group consisting of melamine phosphate, melamine pyrophosphate, melamine polyphosphates, and mixtures thereof. The functionalized poly(arylene ether) is a poly(arylene ether) comprising functionality that is copolymerizable with the vinyl thermoset resin. In some embodiments, the functionalized poly(arylene ether) is a capped poly(arylene ether). The capped poly(arylene ether) comprises copolymerizable functionality at least one terminus of the poly(arylene ether) chain. In other embodiments, the functionalized poly(arylene ether) is a ring-functionalized poly(arylene ether). The ring-functionalized poly(arylene ether) comprises the copolymerizable functionality directly bound to the phenylene ring of one or more phenylene ether groups that can be anywhere in the poly(phenylene ether) chain.

In one embodiment, the functionalized poly(arylene ether) comprises a capped poly(arylene ether) having the formula $$Q(J-K)_y$$

wherein Q is the residuum of a monohydric, dihydric, or polyhydric phenol; y is 1 to 100, more specifically 1, 2, 3, 4, 5, or 6; J has the formula

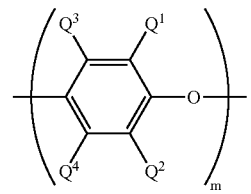

wherein for each structural unit, each $Q^1$ and $Q^2$ is independently halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio (that is, ($C_1$-$C_{12}$ hydrocarbyl)S—), $C_1$-$C_{12}$ hydrocarbyloxy, or $C_2$-$C_{12}$ halohydrocarbyloxy wherein at least two carbon atoms separate the halogen and oxygen atoms; and each $Q^3$ and $Q^4$ is independently hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; m is 1 to about 200; and K is a capping group selected from the group consisting of

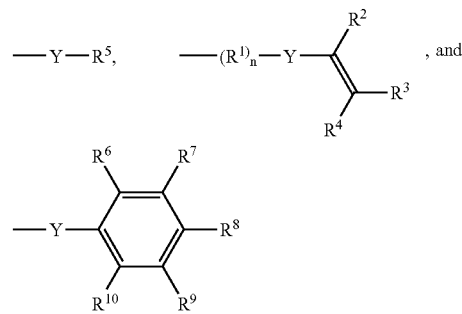

wherein $R^5$ is $C_1$-$C_{12}$ allyl; $R^1$ is $C_1$-$C_{12}$ hydrocarbylene; n is 0 or 1; $R^2$, $R^3$, and $R^4$ are each independently hydrogen or $C_1$-$C_{18}$ hydrocarbyl; $R^6$, $R^7$, $R^8$, $R^9$, and $R^{10}$ are each independently selected from the group consisting of hydrogen, unsubstituted or substituted $C_1$-$C_{12}$ hydrocarbyl, hydroxy, amino, nitrile, formyl, carboxylate, imidate, and thiocarboxylate; and Y is a divalent group selected from the group consisting of

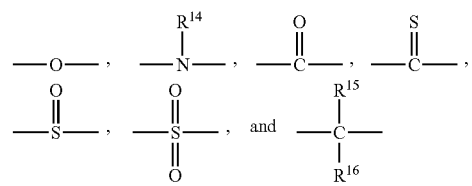

wherein each occurrence of $R^{14}$ is independently selected from the group consisting of hydrogen and $C_1$-$C_{12}$ hydrocarbyl and each occurrence of $R^{15}$ and $R^{16}$ is independently selected from the group consisting of hydrogen, $C_1$-$C_{12}$ hydrocarbyl, and $C_1$-$C_6$ hydrocarbylene wherein $R^{15}$ and $R^{16}$ collectively form a $C_4$-$C_{12}$ alkylene group. As used herein, the term "hydrocarbyl", whether used by itself, or as a prefix, suffix, or fragment of another term, refers to a residue that contains only carbon and hydrogen. The residue can be aliphatic or aromatic, straight-chain, cyclic, bicyclic, branched, saturated, or unsaturated. It can also contain combinations of aliphatic, aromatic, straight chain, cyclic, bicyclic, branched, saturated, and unsaturated hydrocarbon moieties. The hydrocarbyl residue, when described as substituted, may contain heteroatoms over and above the carbon and hydrogen members of the substituent residue. Thus, when specifically noted as containing such heteroatoms, the hydrocarbyl residue may also contain one or more carbonyl groups, amino groups (including mono-($C_1$-$C_{12}$)-alkylamino and di-($C_1$-$C_{12}$)-alkylamino groups), hydroxyl groups, or the like, or it may contain heteroatoms within the backbone of the hydrocarbyl residue.

In some embodiments, Q is the residuum of a phenol, including monohydric, dihydric, or polyhydric phenol, and includes radicals of the structure

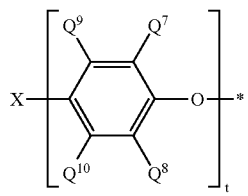

wherein each occurrence of $Q^7$, $Q^8$, $Q^9$, and $Q^{10}$ is independently hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; X may be hydrogen, $C_1$-$C_{18}$ hydrocarbyl, or $C_1$-$C_{18}$ hydrocarbyl containing a substituent such as carboxylic acid, aldehyde, alcohol, amino radicals, or the like; X also may be sulfur, sulfonyl, sulfuryl, oxygen, $C_1$-$C_{12}$ alkylidene, or other such bridging group having a valence of 2 or greater as when Q is derived from a dihydric or polyhydric phenol; t denotes the number of phenylene ether groups bound directly to X (not the number of phenylene ether groups in a poly (phenylene ether) chain originating at X) and is 1 to about 100, specifically 1, 2, 3, 4, 5, or 6, and more specifically about 1 to 2; in a preferred embodiment, y=t. Q may be the residuum of a monohydric phenol. Q may also be the residuum of a diphenol, such as 2,2',6,6'-tetramethyl-4,4'-diphenol. Q may also be the residuum of a bisphenol, such as 2,2-bis(4-hydroxyphenyl)propane ("bisphenol A" or "BPA").

In one embodiment, the capped poly(arylene ether) is produced by capping a poly(arylene ether) consisting essentially of the polymerization product of at least one monohydric phenol having the structure

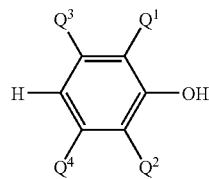

wherein each $Q^1$ and $Q^2$ is independently halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; and each $Q^3$ and $Q^4$ is independently hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms. Suitable monohydric phenols include those described in U.S. Pat. No. 3,306,875 to Hay, and highly preferred monohydric phenols include 2,6-dimethylphenol and 2,3,6-trimethylphenol. The poly(arylene ether) may be a copolymer of at least two monohydric phenols, such as 2,6-dimethylphenol and 2,3,6-trimethylphenol.

In one embodiment, the capped poly(arylene ether) comprises at least one capping group having the structure

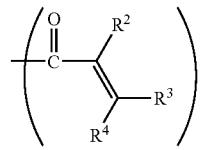

wherein $R^2$, $R^3$, and $R^4$ are each independently hydrogen, $C_1$-$C_{18}$ hydrocarbyl, $C_2$-$C_{18}$ hydrocarbyloxycarbonyl, nitrile, formyl, carboxylate, imidate, thiocarboxylate, or the like. In some embodiments, the capped poly(arylene ether) comprises at least one acrylate ($R^{11}$=$R^{12}$=$R^{13}$=hydrogen) or methacrylate ($R^{11}$=methyl, $R^{12}$=$R^{13}$=hydrogen) capping group. It will be understood that the prefix "(meth)acryl-" includes both "acryl-" and "methacryl-".

In some embodiments, the capped poly(arylene ether) corresponds to the Q(J-K)$_y$ structure above wherein Q is the residuum of a monohydric phenol, and y is 1. For example, the capped poly(arylene ether) may be a monocapped poly (arylene ether) having the structure

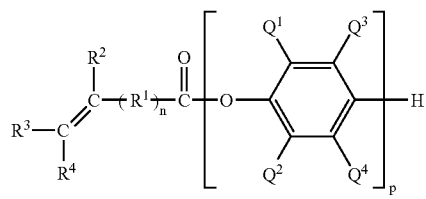

wherein each occurrence of $Q^1$ and $Q^2$ is independently halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; each occurrence of $Q^3$ and $Q^4$ is independently hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; p is 1 to about 100, specifically 1 to about 30, more specifically 1 to about 20; $R^1$ is $C_1$-$C_{12}$ hydrocarbylene; n is 0 or 1; and $R^2$, $R^3$, and $R^4$ are each independently hydrogen or $C_1$-$C_{18}$ hydrocarbyl; wherein the capped poly(arylene ether) has an intrinsic viscosity of about 0.03 to about 0.20 deciliter per gram, measured at 25° C. in chloroform.

In some embodiments, the capped poly(arylene ether) is a monocapped poly(arylene ether) having the structure

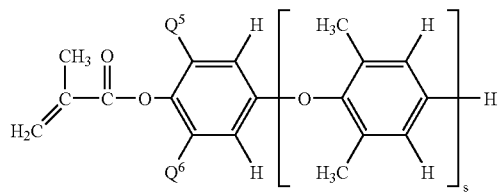

wherein $Q^5$ and $Q^6$ are each independently methyl or di-n-butylaminomethyl; s is 1 to about 20, specifically 1 to about 15, more specifically 1 to about 10, still more specifically 1 to about 8; and the capped poly(arylene ether) has an intrinsic viscosity of about 0.03 to about 0.20 deciliter per gram, measured at 25° C. in chloroform.

In some embodiments, the capped poly(arylene ether) corresponds to the $Q(J\text{-}K)_y$ structure above wherein Q is the residuum of a dihydric phenol, and y is 2. For example, the capped poly(arylene ether) may be a bicapped poly(arylene ether) having the structure

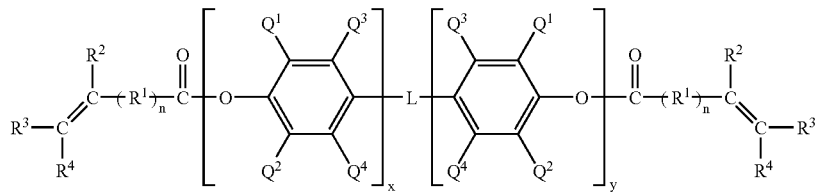

wherein each occurrence of $Q^1$ and $Q^2$ is independently halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; each occurrence of $Q^3$ and $Q^4$ is independently hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; each occurrence of x and y is independently 0 to about 100 with the proviso that the sum of x and y is 2 to about 100; each occurrence of $R^1$ is independently $C_1$-$C_{12}$ hydrocarbylene; each occurrence of n is independently 0 or 1; each occurrence of $R^2$-$R^4$ is independently hydrogen or $C_1$-$C_{18}$ hydrocarbyl; and L has the structure

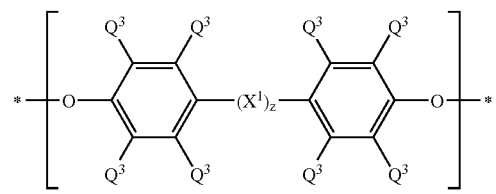

wherein each occurrence of $Q^3$ is independently hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; z is 0 or 1; and $X^1$ has a structure selected from the group consisting of

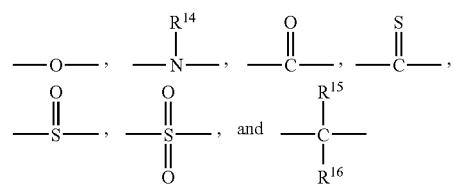

wherein each occurrence of $R^{14}$ is independently selected from the group consisting of hydrogen and $C_1$-$C_{12}$ hydrocarbyl and each occurrence of $R^{15}$ and $R^{16}$ is independently selected from the group consisting of hydrogen, $C_1$-$C_{12}$ hydrocarbyl, and $C_1$-$C_6$ hydrocarbylene wherein $R^{15}$ and $R^{16}$ collectively form a $C_4$-$C_{12}$ alkylene group; wherein the capped poly(arylene ether) has an intrinsic viscosity of about 0.03 to about 0.20 deciliter per gram, specifically about 0.06 to about 0.15 deciliter per gram, more specifically about 0.06 to about 0.12 deciliter per gram, even more specifically about 0.06 to about 0.09 deciliter per gram, measured at 25° C. in chloroform.

In some embodiments, the functionalized poly(arylene ether) is a bicapped poly(arylene ether) having the structure

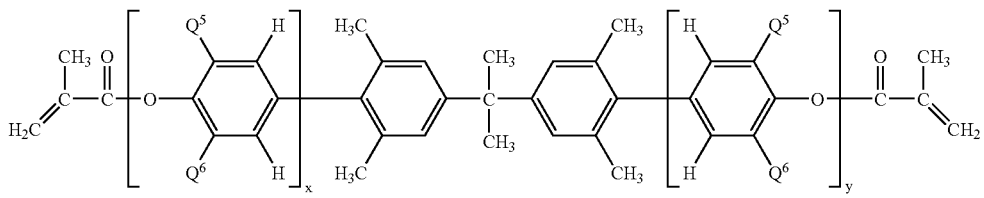

wherein each occurrence of $Q^5$ and $Q^6$ is independently methyl or di-n-butylaminomethyl; each occurrence of x and y is independently 0 to about 100 with the proviso that the sum of x and y is 2 to about 100.

In some embodiments, the functionalized poly(arylene ether) is a capped poly(arylene ether) having the structure

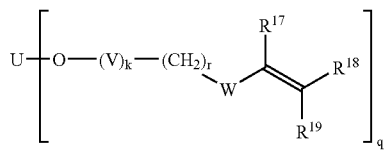

wherein U is a $C_6$-$C_{18}$ aryl group optionally substituted with one or more $C_1$-$C_6$ alkyl groups; V is a phenylene ether group; k is 1 to about 100; r is 1 to 6; W is a phenylene group or an oxygen atom; each occurrence of $R^{17}$, $R^{18}$, and $R^{19}$ is independently selected from the group consisting of hydrogen, $C_1$-$C_6$ alkyl, $C_2$-$C_6$ alkenyl, and $C_2$-$C_6$ alkynyl; and q is 1, 2, 3, or 4. Procedures for synthesizing capped poly(arylene ether)s having this structure are described in U.S. Patent Application Publication No. U.S. 2004/0146692 A1 of Inoue et al.

The functionalized poly(arylene ether) may be a ring-functionalized poly(arylene ether). Suitable ring-functionalized poly(arylene ether)s include those comprising repeating structural units of the formula

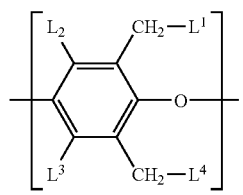

wherein each $L^1$-$L^4$ is independently hydrogen, a $C_1$-$C_{12}$ alkyl group, an alkenyl group, or an alkynyl group; wherein the alkenyl group is represented by

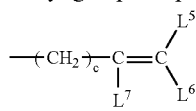

wherein $L^5$, $L^6$, and $L^7$ are each independently hydrogen or methyl, and c is 0, 1, 2, 3, or 4; wherein the alkynyl group is represented by

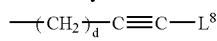

wherein $L^8$ is hydrogen, methyl, or ethyl, and d is 0, 1, 2, 3, or 4; and wherein about 0.02 mole percent to about 25 mole percent of the total $L^1$-$L^4$ substituents in the ring-functionalized poly(arylene ether) are alkenyl and/or alkynyl groups. Within this range, the mole percent of total $L^1$-$L^4$ substituents that are alkenyl and/or alkynyl groups may specifically be at least about 0.1 mole percent, more specifically at least about 0.5 mole percent. Also within this range, it may be preferred to have up to about 15 mole percent, more preferably up to about 10 mole percent, alkenyl and/or alkynyl groups. The ring-functionalized poly(arylene ether) of this embodiment may be prepared according to known methods. For example, an unfunctionalized poly(arylene ether) such as poly(2,6-dimethyl-1,4-phenylene ether) may be metallized with a reagent such as n-butyl lithium and subsequently reacted with an alkenyl halide such as allyl bromide and/or an alkynyl halide such as propargyl bromide. This and other methods for preparation of ring-functionalized poly(arylene ether) resins are described, for example, in U.S. Pat. No. 4,923,932 to Katayose et al. In some embodiments, the ring-functionalized poly(arylene ether) is the product of the melt reaction of a poly(arylene ether) and an α,β-unsaturated carbonyl compound or a β-hydroxy carbonyl compound. Examples of α,β-unsaturated carbonyl compounds include, for example, maleic anhydride, citriconic anhydride, and the like. Examples of β-hydroxy carbonyl compounds include, for example, citric acid, and the like. Such functionalization is typically carried out by melt blending a poly(arylene ether) with the desired carbonyl compound at a temperature of about 190 to about 290° C.

Any of the above-described functionalized poly(arylene ether)s may contain minor amounts of structural units formed as a result of side reactions occurring during poly(arylene ether) synthesis or processing. For example, when a functionalized poly(arylene ether) is prepared by method comprising oxidative polymerization of 2,6-dimethylphenol in the presence of a secondary amine, thermal decomposition may generate minor amounts of the structural units

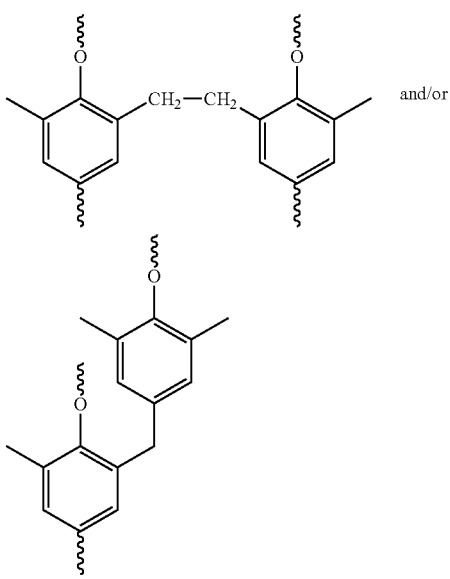

wherein the wavy bonds represent connections to the remainder of the functionalized poly(arylene ether) molecule.

In addition to the functionalized poly(arylene ether), the curable composition comprises a vinyl thermoset resin. A vinyl thermoset resin is a compound comprising a polymerizable carbon-carbon double bond or triple bond. Suitable classes of vinyl thermoset resins include maleimide resins, benzoxazine resins, vinylbenzyl ether resins, alkene- or alkyne-containing monomers, arylcyclobutene resins, perfluorovinyl ether resins, oligomers and polymers with curable vinyl functionality, and combinations thereof.

The vinyl thermoset resin may be a maleimide resin. Suitable maleimides include those having the structure

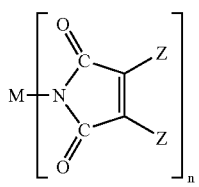

wherein M is a radical and having a valence n and containing 2 to 40 carbon atoms and optionally one or more heteroatoms; each occurrence of Z is independently hydrogen, halogen, or $C_1$-$C_{18}$ hydrocarbyl; and n is 1 to about 10, specifically 2 or 3 or 4. M can be, for example, aliphatic, cycloaliphatic, aromatic, or heterocyclic. Suitable maleimides include those represented by the structures

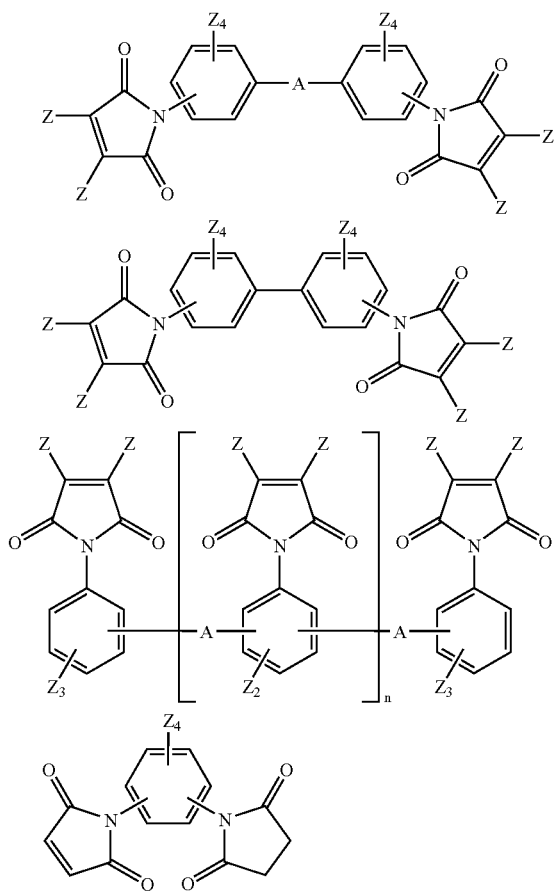

wherein each occurrence of Z is independently hydrogen, $C_1$-$C_{18}$ hydrocarbyl, or halogen; A is $C_1$-$C_{18}$ hydrocarbylene, oxy, sulfone, sulfinyl, carboxylate, carbonyl, carbonamide, or sulfide; and n is 0 to about 10.

Specific examples of maleimide resins include 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenylether, 3,3'-bismaleimidodiphenylsulfone, 4,4'-bismaleimidodiphenylsulfone, 4,4'-bismaleimidodicyclohexylmethane, 3,5-bis(4-maleimidophenyl)pyridine, 2,6-bismaleimidopyridine, 1,3-bis(maleimidomethyl)cyclohexane, 1,3-bis(maleimidomethyl)benzene, 1,1-bis(4-maleimidophenyl)cyclohexane, 1,3-bis(dichloromaleimido)benzene, 4,4'-bis(citraconimido)diphenylmethane, 2,2-bis(4-maleimidophenyl)propane, 1-phenyl-1,1-bis(4-maleimidophenyl)ethane, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N N'-4,4'-diphenylmethanebismaleimide, N N'-4,4'-diphenyletherbismaleimide, N N'-4,4'-diphenylsufonebismaleimide, N N'-4,4'-dicyclohexylmethanebismaleimide, N N'-α,α'-4,4'-dimethylenecyclohexanebismaleimide, N N'-m-methaxylenebismaleimide, N,N'-4,4'-diphenylcyclohexanebismaleimide, and N,N'-methylenebis(3-chloro-p-phenylene)bismaleimide, as well as the maleimide resins disclosed in U.S. Pat. No. 3,562,223 to Bargain et al., and U.S. Pat. No. 4,211,860 and U.S. Pat. No. 4,211,861 to Stenzenberger. Maleimide resins can be prepared by methods known in the art, as described, for example, in U.S. Pat. No. 3,018,290 to Sauters et al. In some embodiments, the maleimide resin is NN'-4,4'-diphenylmethane bismaleimide.

The maleimide resin can be a reaction product or prepolymer of a polyfunctional unsaturated imide, such as a bisimide, and an effective chain-extending agent such as an amine-group-containing compound. Suitable amine-group-containing compounds include diamines, hydroxylamines, and polyamines. Examples include bis(4-(N-methylamino)phenyl)methane, N N'-dimethyl-1,3-diaminobenzene 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, benzidine, 4,4'-diaminophenyl oxide, 4,4'-diaminodiphenylsulfone, bis(4-aminophenyl)phenylphosphine oxide, bis(4-aminophenyl)methylamine, 1,5-diaminonaphthalene, m-xylenediamine, p-xylenediamine, hexamethylenediamime, 6,6'-diamine-2,2'-pyridyl, 4,4'-diaminobenzophenone, 4,4'-diaminoazobenzene, bis(4-aminophenyl)phenylmethane, 1,1-bis(4-aminophenyl)cyclohexane, 1,1-bis(4-amino-3-methylphenyl)cyclohexane, 2,5-bis(m-aminophenyl)-1,3,4-oxadiazole, 2,5-bis(p-aminophenyl)-1,3,4-oxadiazole, 2,5-bis(m-aminophenyl)thiazo(4,5-d)thiazole, 5,5'-di(m-aminophenyl)-(2,2')-bis-(1,3,4-oxadiazolyl), 4,4'-diaminodiphenylether, 4,4'-bis(p-aminophenyl)-2,2'-dithiazole, m-bis(4-p-aminophenyl-2-thiazolyl)benzene, 4,4'-diaminobenzanilide, 4,4'-diaminophenyl benzoate, N N'-bis(4-aminobenzyl)-p-phenylenediamine, 4,4'-methylenebis(2-chloroaniline), and the like.

Such reaction products can be prepared by methods known in the art, such as contacting about 0.1 to about 0.8 mole of the chain-extending agent with each mole of the bisimide in an organic solvent at a temperature of about 40 to about 200° C. for a time of about 5 minutes to about 5 hours. The maleimide resin can be, for example, a hydrazide-modified bismaleimide as described in U.S. Pat. Nos. 4,211,860 and 4,211,861 to Stenzenberger. Suitable N,N'-unsaturated bismaleimide resins are commercially available from Technochemie GmbH as Compimide resins. The maleimide resin can be a mixture of maleimide resins tailored to meet specific processing requirements.

The vinyl thermoset resin may be a benzoxazine resin. Suitable benzoxazine resins include those having the structure

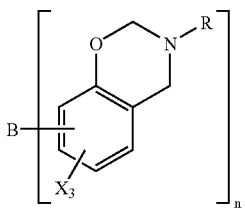

wherein B is a linear or branched hydrocarbon group having 1 to about 80 carbon atoms, specifically about 1 to 10 carbon atoms (in some embodiments, B is an alkyl group, a cycloalkyl group, carbonyl, sulfonyl, sulfinyl, sulfide, oxy, alkylphosphonyl, arylphosphonyl, isoalkylidene, cycloalkylidene, arylalkylidene, diarylmethylidene, methylidene dialkylsilanyl, arylalkylsilanyl, or diarylsilanyl); n is 1 to 20, specifically 1, 2, 3, or 4, more specifically 2; and X is hydrogen, $C_1$-$C_{18}$ hydrocarbyl optionally substituted with one or more fluorine atoms, or $C_1$-$C_{40}$ hydrocarbyl amine (including polyamines). Depending on whether phenolic or phenoxy repeat units are desired in the polybenzoxazine, it may be desirable that at least one non-hydrogen X substituent be ortho, meta, or para to the oxygen atom of the benzoxazine.

As is well known, benzoxazine monomers are made from the reaction of aldehydes, phenols, and primary amines with or without solvent. U.S. Pat. No. 5,543,516 to Ishida describes a solventless method of forming benzoxazine monomers. An article by Ning and Ishida in *Journal of Polymer Science, Chemistry Edition*, vol. 32, page 1121 (1994) describes a procedure using a solvent. The procedure using solvent is generally common to the literature of benzoxazine monomers. Suitable phenolic compounds include phenols and polyphenols. The use of polyphenols with two or more hydroxyl groups reactive in forming benzoxazines may result in branched and/or crosslinked products. The groups connecting the phenolic groups into a phenol can be branch points or connecting groups in the polybenzoxazine.

Phenols suitable for use in the preparation of benzoxazine monomers include phenol, cresol, resorcinol, catechol, hydroquinone, 2-allylphenol, 3-allylphenol, 4-allylphenol, 2,6-dihydroxynaphthalene, 2,7-dihydrooxynapthalene, 2-(diphenylphosphoryl)hydroquinone, 2,2'-biphenol, 4,4-biphenol, 4,4'-isopropylidenediphenol (bisphenol A), 4,4'-isopropylidenebis(2-methylphenol), 4,4'-isopropylidenebis(2-allylphenol), 4,4' (1,3-phenylenediisopropylidene)bisphenol (bisphenol M), 4,4'-isopropylidenebis(3-phenylphenol)4,4'-(1,4-phenylenediisoproylidene)bisphenol (bisphenol P), 4,4'-ethylidenediphenol (bisphenol E), 4,4'-oxydiphenol, 4,4'-thiodiphenol, 4,4'-sulfonyldiphenol, 4,4'-sulfinyldiphenol, 4,4'-hexafluoroisoproylidenebisphenol (Bisphenol AF), 4,4'-(1-phenylethylidene)bisphenol (Bisphenol AP), bis(4-hydroxyphenyl)-2,2-dichloroethylene (Bisphenol C), bis(4-hydroxyphenyl)methane (Bisphenol-F), 4,4'-(cyclopentylidene)diphenol, 4,4'-(cyclohexylidene)diphenol (Bisphenol Z), 4,4'-(cyclododecylidene)diphenol 4,4'-(bicyclo[2.2.1]heptylidene)diphenol, 4,4'-(9H-fluorene-9,9-diyl)diphenol, isopropylidenebis(2-allylphenol), 3,3-bis(4-hydroxyphenyl) isobenzofuran-1(3H)-one, 1-(4-hydroxyphenyl)-3,3-dimethyl-2,3-dihydro-1H-inden-5-ol, 3,3,3',3'-tetramethyl-2,2', 3,3'-tetrahydro-1,1'-spirobi[indene]-5,6'-diol (spirobiindane), dihydroxybenzophenone (bisphenol K), tris (4-hydroxyphenyl)methane, tris(4-hydroxyphenyl)ethane, tris(4-hydroxyphenyl)propane, tris(4-hydroxyphenyl)butane, tris(3-methyl-4-hydroxyphenyl)methane, tetrakis(4-hydroxyphenyl)ethane dicyclopentadienylbis(2,6-dimethyl phenol), dicyclopentadienyl bis(ortho-cresol), dicyclopentadienyl bisphenol, and the like.

The aldehyde used to form the benzoxazine can be any aldehyde. In some embodiments, the aldehyde has 1 to about 10 carbon atoms. In some embodiments, the aldehyde is formaldehyde. The amine used to form the benzoxazine can be an aromatic amine, an aliphatic amine, an alkyl substituted aromatic, or an aromatic substituted alkyl amine. The amine can also be a polyamine, although the use of polyamines will, under some circumstances, yield polyfunctional benzoxazine monomers. Polyfunctional benzoxazine monomers are more likely to result in branched and/or crosslinked polybenzoxazines than monofunctional benzoxazines, which would be anticipated to yield thermoplastic polybenzoxazines.

The amines generally have 1 to about 40 carbon atoms unless they include aromatic rings, and then they may have 6 to about 40 carbon atoms. The amine of a di- or polyfunctional amine may also serve as a branch point to connect one polybenzoxazine to another. Thermal polymerization has been the preferred method for polymerizing benzoxazine monomers. The temperature to induce thermal polymerization is typically varied from about 150 to about 300° C. The polymerization is typically performed in bulk, but may also be performed in solution. Catalysts, such as carboxylic acids, have been known to slightly lower the polymerization temperature or accelerate the polymerization rate at the same temperature.

Cationic polymerization initiators have been found to result in polymerization of benzoxazine monomers at temperatures as low as cryogenic temperatures. Preferred temperatures are –100 to about 250° C., specifically about –60 to about 150° C. for ease of handling the reactants and products. Some of the cationic initiators, for example $PCl_5$, form repeating units from the benzoxazine monomers that include a salt of the amine. These repeating units have better solubility in polar solvents, such as water, than similar repeating units without the amine salt. The initiators can be used either in the benzoxazine melt or in the presence of solvent, allowing the solvent content to be from 0 to nearly 100%. Many solvents can be used in cationic polymerizations, and their selection is known by those skilled in the art of cationic polymerization.

The polymers from the cationically initiated polymerization of benzoxazine are useful as molded articles with good thermal stability and/or flame resistance, such as molded circuit boards, flame resistant laminates, or other molded articles, and is a source of precursor to high temperature resistant chars. The common uses for high temperature resistant chars include aircraft brake discs, equipment for sintering reactions, and heat shields or heat shielding material. The polymers that include repeating units having amine salts can be used in applications for partially or fully water soluble polymers such as viscosity control agents.

Generally, cationic initiators can polymerize benzoxazine monomers or oligomers. Suitable cationic initiators include $H_2SO_4$, $HClO_4$, $BF_3$, $AlCl_3$, t-BuCl/$Et_2AlCl$, $Cl_2$/$BCl_3$, AlBr$_3$, AlBr3.TiCl$_4$, I$_2$, SnCl$_4$, WCl$_6$, AlEt$_2$Cl, PF$_5$, VCl$_4$, AlEtCl$_2$, and BF$_3$Et$_2$O. In some embodiments, the polymerization initiator is PCl$_5$, PCl$_3$, POCl$_3$, TiCl$_5$, SbCl$_5$, (C$_6$H$_5$)$_3$C$^+$(SbCl$_6$)$^-$, or metallophorphyrin compounds such as aluminum phthalocyanine chloride, which are all known to result in similar polymers from cationically initiated polymerization of unsaturated monomers. Suitable cationic initiators further include ethyl tosylate, methyl triflate, and triflic acid. Typically, each initiator initiates a polymer with from about 3 to about 3,000 repeat units, so the amount of initiator needed on a mole percent basis relative to the monomer is small. However, additional initiator may be needed to compensate for loss due to adventitious moisture and other reactants that deactivate cations. In some embodiments, about 0.001 to about 50 mole percent initiator based upon the monomer, specifically about 0.01 to about 10 mole percent initiator, is used for these cationically initiated polymerizations.

The vinyl thermoset resin may be a vinylbenzyl ether resin. Vinylbenzyl ether resins include those having the structure

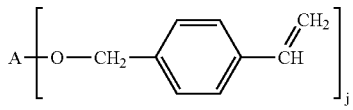

wherein A is an organic or inorganic radical of valence j, and j is from 1 to about 100, specifically 1, 2, 3, 4, 5, 6, 7, or 8, more specifically 2, 3, or 4. Vinylbenzyl ether resins may be most readily prepared from condensation of a phenol with a vinyl benzyl halide, such as vinylbenzyl chloride to produce a vinylbenzyl ether. Bisphenol-A and trisphenols and polyphenols are generally used to produce poly(vinylbenzyl ethers) that may be used to produce crosslinked thermosetting resins. Suitable vinyl benzyl ethers include those produced from reaction of vinylbenzyl chloride or vinylbenzyl bromide with resorcinol, catechol, hydroquinone, 2,6-dihydroxy naphthalene, 2,7-dihydroxynapthalene, 2-(diphenylphosphoryl)hydroquinone, bis(2,6-dimethylphenol)2,2'-biphenol, 4,4-biphenol, 2,2',6,6'-tetramethylbiphenol, 2,2',3,3',6,6'-hexamethylbiphenol, 3,3',5,5'-tetrabromo-2,2',6,6'-tetramethylbiphenol, 3,3'-dibromo-2,2',6,6'-tetramethylbiphenol, 2,2',6,6'-tetramethyl-3,3',5-dibromobiphenol, 4,4'-isopropylidenediphenol (bisphenol A), 4,4'-isopropylidenebis(2,6-dibromophenol) (tetrabromobisphenol A), 4,4'-isopropylidenebis(2,6-dimethylphenol) (teramethylbisphenol A), 4,4'-isopropylidenebis(2-methylphenol), 4,4'-isopropylidenebis(2-allylphenol), 4,4'(1,3-phenylenediisopropylidene)bisphenol (bisphenol M), 4,4'-isopropylidenebis(3-phenylphenol), 4,4'-(1,4-phenylenediisoproylidene)bisphenol (bisphenol P), 4,4'-ethylidenediphenol (bisphenol E), 4,4'oxydiphenol, 4,4'thiodiphenol, 4,4'thiobis(2,6-dimethylphenol), 4,4'-sulfonyldiphenol, 4,4'-sulfonylbis(2,6-dimethylphenol)4,4'-sulfinyldiphenol, 4,4'-hexafluoroisoproylidene)bisphenol (Bisphenol AF), 4,4'-(1-phenylethylidene)bisphenol (Bisphenol AP), bis(4-hydroxyphenyl)-2,2-dichloroethylene (Bisphenol C), bis(4-hydroxyphenyl)methane (Bisphenol-F), bis(2,6-dimethyl-4-hydroxyphenyl)methane, 4,4'-(cyclopentylidene)diphenol, 4,4'-(cyclohexylidene)diphenol (Bisphenol Z), 4,4'-(cyclododecylidene)diphenol 4,4'-(bicyclo[2.2.1]heptylidene)diphenol, 4,4'-(9H-fluorene-9,9-diyl)diphenol, 3,3-bis(4-hydroxyphenyl)isobenzofuran-1(3H)-one, 1-(4-hydroxyphenyl)-3,3-dimethyl-2,3-dihydro-1H-inden-5-ol, 1-(4-hydroxy-3,5-dimethylphenyl)-1,3,3,4,6-pentamethyl-2,3-dihydro-1H-inden-5-ol, 3,3,3',3'-tetramethyl-2,2',3,3'-tetrahydro-1,1'-spirobi[indene]-5,6'-diol (Spirobiindane), dihydroxybenzophenone (bisphenol K), tris(4-hydroxyphenyl)methane, tris(4-hydroxyphenyl) ethane, tris(4-hydroxyphenyl)propane, tris(4-hydroxyphenyl)butane, tris(3-methyl-4-hydroxyphenyl)methane, tris(3,5-dimethyl-4-hydroxyphenyl)methane, tetrakis(4-hydroxyphenyl)ethane, tetrakis(3,5-dimethyl-4-hydroxyphenyl)ethane, bis(4-hydroxyphenyl) phenylphosphine oxide, dicyclopentadienylbis(2,6-dimethyl phenol), dicyclopentadienyl bis(ortho-cresol), dicyclopentadienyl bisphenol, and the like.

The vinyl thermoset resin may be an alkene-containing monomer or an alkyne-containing monomer. Suitable alkene- and alkyne-containing monomers include those described in U.S. Pat. No. 6,627,704 to Yeager et al. One class of alkene-containing monomers is the acrylate-containing compounds having the structure

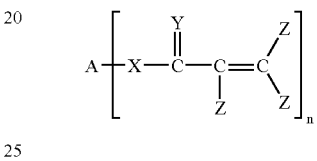

wherein A is an organic or inorganic radical of valence n; X is nitrogen or oxygen; Y is oxygen or sulfur; and each occurrence of Z is independently chosen from hydrogen, halogen, and C$_1$-C$_{24}$ hydrocarbyl. Suitable alkene-containing monomers include acrylate- and methacrylate-functionalized materials capable of undergoing free radical polymerization. They can be monomers and/or oligomers such as (meth) acrylates, (meth)acrylamides, N-vinylpyrrolidone and vinylazlactones as disclosed in U.S. Pat. No. 4,304,705 of Heilman et al. Such monomers include mono-, di-, and polyacrylates and methacrylates, such as methyl acrylate, methyl methacrylate, ethyl acrylate, isopropyl methacrylate, isooctyl acrylate, isobornyl acrylate, isobornyl methacrylate, acrylic acid, n-hexyl acrylate, tetrahydrofurfuryl acrylate, N-vinylcaprolactam, N-vinylpyrrolidone, acrylonitrile, stearyl acrylate, allyl acrylate, glycerol diacrylate, glycerol triacrylate, ethylene glycol diacrylate, diethylene glycol diacrylate, triethylene glycol dimethacrylate, 1,6-hexanediol diacrylate, 1,3-propanediol diacrylate, 1,3-propanediol dimethacrylate, trimethylolpropane triacrylate, 1,2,4-butanetriol trimethacrylate, 2-phenoxyethyl acrylate, 1,4-cyclohexanediol diacrylate, pentaerythritol triacrylate, pentaerythritol tetraacrylate, pentaerythritol tetramethacrylate, sorbitol hexaacrylate, bis[1-(2-acryloxy)]-p-ethoxyphenyldimethylmethane, 2,2-bis[1-(3-acryloxy-2-hydroxy)]propoxyphenylpropane, tris(hydroxyethyl)isocyanurate trimethacrylate; the bis-acrylates and bis-methacrylates of polyethylene glycols of number average molecular weight 200-500 atomic mass units, and bis-acrylates and bis-methacrylates of polybutadienes of number average molecular weight 1000-10,000 atomic mass units, copolymerizable mixtures of acrylated monomers such as those disclosed in U.S. Pat. No. 4,652,274 to Boettcher et al.; and acrylated oligomers such as those disclosed in U.S. Pat. No. 4,642,126 to Zador et al.

It may be desirable to crosslinker the alkene- or alkyne-containing monomer. Particularly useful as crosslinker compounds are acrylates such as allyl acrylate, glycerol diacrylate, glycerol triacrylate, ethylene glycol diacrylate, diethylene glycol diacrylate, triethylene glycol dimethacrylate, 1,6-hexanediol diacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexaacrylate, bis[1-(2-acryloxy)]-p-ethoxyphenyldimethylmethane, 2,2-bis[1-(3-acryloxy-2-hydroxy)]propoxyphenylpropane, tris(hydroxyethyl)isocyanurate trimethacrylate; and the bis-acrylates and bis-methacrylates of polyethylene glycols of average molecular weight 200-500 atomic mass units.

Also included among alkene- or alkyne-containing monomers are allylic resins and styrenic resins for example triallylisocyanurate, trimethallylisocyanurate, trimethallylcyanurate, triallylcyanurate, divinyl benzene, and dibromostyrene, as well as others described in U.S. Pat. No. 6,627,704 to Yeager et al.

The vinyl thermoset resin may be an arylcyclobutene resin. Arylcyclobutenes include those derived from compounds of the general structure

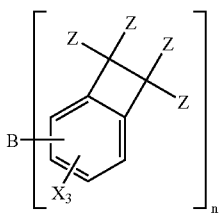

wherein B is an organic or inorganic radical of valence n (including carbonyl, sulfonyl, sulfinyl, sulfide, oxy, alkylphosphonyl, arylphosphonyl, isoalkylidene, cycloalkylidene, arylalkylidene, diarylmethylidene, methylidene dialkylsilanyl, arylalkylsilanyl, diarylsilanyl, and $C_6$-$C_{20}$ phenolic compounds); each occurrence of X is independently hydroxy or $C_1$-$C_{24}$ hydrocarbyl (including linear and branched alkyl and cycloalkyl); each occurrence of Z is independently hydrogen, halogen, or $C_1$-$C_{12}$ hydrocarbyl; and n is 1 to 1000, specifically 1 to 8, more specifically 2 or 3 or 4. Other useful arylcyclobutenes and methods of arylcyclobutene synthesis may be found in U.S. Pat. Nos. 4,743,399, 4,540,763, 4,642,329, 4,661,193, and 4,724,260 to Kirchhoff et al., and U.S. Pat. No. 5,391,650 to Brennan et al.

The vinyl thermoset resin may be a perfluorovinyl ether resin. Useful perfluorovinyl ethers include those having the structure

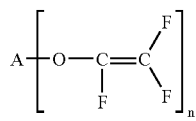

wherein A is a divalent organic or inorganic radical of valence n; and n is 1 to about 1000, specifically 1 to 8, more specifically 2 or 3 or 4.

Perfluorovinyl ethers are typically synthesized from phenols and bromotetrafluoroethane followed by zinc catalyzed reductive elimination producing ZnFBr and the desired perfluorovinylether. By this route bis, tris, and other polyphenols can produce bis-, tris- and poly(perfluorovinylether)s. Phenols useful in their synthesis include resorcinol, catechol, hydroquinone, 2,6-dihydroxy naphthalene, 2,7-dihydroxynapthalene, 2-(diphenylphosphoryl)hydroquinone, bis(2,6-dimethylphenol) 2,2'-biphenol, 4,4-biphenol, 2,2',6,6'-tetramethylbiphenol, 2,2',3,3',6,6'-hexamethylbiphenol, 3,3',5,5'-tetrabromo-2,2',6,6'-tetramethylbiphenol, 3,3'-dibromo-2,2',6,6'-tetramethylbiphenol, 2,2',6,6'-tetramethyl-3,3'5-dibromobiphenol, 4,4'-isopropylidenediphenol (bisphenol A), 4,4'-isopropylidenebis(2,6-dibromophenol) (tetrabromobisphenol A), 4,4'-isopropylidenebis(2,6-dimethylphenol) (teramethylbisphenol A), 4,4'-isopropylidenebis(2-methylphenol), 4,4'-isopropylidenebis(2-allylphenol), 4,4'-(1,3-phenylenediisopropylidene)bisphenol (bisphenol M), 4,4'-isopropylidenebis(3-phenylphenol) 4,4'-(1,4-phenylenediisoproylidene)bisphenol (bisphenol P), 4,4'-ethylidenediphenol (bisphenol E), 4,4'-oxydiphenol, 4,4'-thiodiphenol, 4,4'-thiobis(2,6-dimethylphenol), 4,4'-sulfonyldiphenol, 4,4'-sulfonylbis(2,6-dimethylphenol) 4,4'-sulfinyldiphenol, 4,4'-hexafluoroisoproylidenebisphenol (Bisphenol AF), 4,4'(1-phenylethylidene)bisphenol (Bisphenol AP), bis(4-hydroxyphenyl)-2,2-dichloroethylene (Bisphenol C), bis(4-hydroxyphenyl)methane (Bisphenol-F), bis(2,6-dimethyl-4-hydroxyphenyl)methane, 4,4'-(cyclopentylidene)diphenol, 4,4'-(cyclohexylidene)diphenol (Bisphenol Z), 4,4'-(cyclododecylidene)diphenol 4,4'-(bicyclo[2.2.1]heptylidene)diphenol, 4,4'-(9H-fluorene-9,9-diyl)diphenol, 3,3-bis(4-hydroxyphenyl)isobenzofuran-1(3H)-one, 1-(4-hydroxyphenyl)-3,3-dimethyl-2,3-dihydro-1H-inden-5-ol, 1-(4-hydroxy-3,5-dimethylphenyl)-1,3,3,4,6-pentamethyl-2,3-dihydro-1H-inden-5-ol, 3,3,3',3'-tetramethyl-2,2',3,3'-tetrahydro-1,1'-spirobi[indene]-5,6'-diol (spirobiindane), dihydroxybenzophenone (bisphenol K), tris(4-hydroxyphenyl)methane, tris(4-hydroxyphenyl)ethane, tris(4-hydroxyphenyl)propane, tris(4-hydroxyphenyl)butane, tris(3-methyl-4-hydroxyphenyl)methane, tris(3,5-dimethyl-4-hydroxyphenyl)methane, tetrakis(4-hydroxyphenyl)ethane, tetrakis(3,5-dimethyl-4-hydroxyphenyl)ethane, bis(4-hydroxyphenyl) phenylphosphine oxide, dicyclopentadienylbis(2,6-dimethyl phenol), dicyclopentadienyl bis(2-methylphenol), dicyclopentadienyl bisphenol, and the like.

The vinyl thermoset resin may be an oligomer or polymer with curable vinyl functionality. Such materials include oligomers and polymers having crosslinkable unsaturated bonding. Examples include styrene butadiene rubber (SBR), butadiene rubber (BR), and nitrile butadiene rubber (NBR) having unsaturated bonding based on butadiene; natural rubber (NR), isoprene rubber (IR), chloroprene rubber (CR), butyl rubber (IIR), and halogenated butyl rubber having unsaturated bonding based on isoprene; ethylene-α-olefin copolymer elastomers having unsaturated bonding based on dicyclopentadiene (DCPD), ethylidene norbornene (ENB), or 1,4-dihexadiene (1,4-HD) (namely, ethylene-α-olefin copolymers obtained by copolymerizing ethylene, an α-olefin, and a diene, such as ethylene-propylenediene terpolymer (EPDM) and ethylene-butene-diene terpolymer (EBDM)). In some embodiments, an EBDM is used. Examples also include hydrogenated nitrile rubber, fluorocarbon rubbers such as vinylidenefluoride-hexafluoropropene copolymer and vinylidenefluoride-pentafluoropropene copolymer, epichlorohydrin homopolymer (CO), copolymer rubber (ECO) prepared from epichlorohydrin and ethylene oxide, epichlorohydrin allyl glycidyl copolymer, propylene oxide allyl glycidyl ether copolymer, propylene oxide epichlorohydrin allyl glycidyl ether terpolymer, acrylic rubber (ACM), urethane rubber (U), silicone rubber (Q), chlorosulfonated polyethylene rubber (CSM), polysulfide rubber (T) and ethylene acrylic rubber. Further examples include various liquid rubbers, for example various types of liquid butadiene rubbers, and the liquid atactic butadiene rubber that is butadiene polymer with 1,2-vinyl connection prepared by anionic living polymerization. It is also possible to use liquid styrene butadiene rubber, liquid nitrile butadiene rubber (CTBN, VTBN, ATBN, etc. by Ube Industries, Ltd.), liquid chloroprene rubber, liquid polyisoprene, dicyclopentadiene type hydrocarbon polymer, and polynorbornene (for example, as sold by Elf Atochem).

Polybutadiene resins, generally polybutadienes containing high levels of 1,2 addition, are desirable for thermosetting matrices. Also included are the functionalized polybutadienes and poly(butadiene-styrene) random copolymers sold by Ricon Resins, Inc. under the trade names RICON, RICACRYL, and RICOBOND resins. These include polybutadienes containing both low vinyl content such as RICON 130, 131, 134, 142, and polybutadienes containing high vinyl content such as RICON 150, 152, 153, 154, 156, 157, and P30D; also random copolymers of styrene and butadiene including RICON 100, 181, 184, and maleic anhydride grafted polybutadienes and the alcohol condensates derived therefrom such as RICON 130MA8, RICON MA13, RICON 130MA20, RICON 131MAS, RICON 131MA10, RICON MA17, RICON MA20, RICON 184MA6 and RICON 156MA17; also included are polybutadienes which may be used to improve adhesion including RICOBOND 1031, RICOBOND 1731, RICOBOND 2031, RICACRYL 3500, RICOBOND 1756, and RICACRYL 3500; also are included the polybutadienes RICON 104 (25% polybutadiene in heptane), RICON 257 (35% polybutadiene in styrene), and RICON 257 (35% polybutadiene in styrene); also are included are (meth)acrylic functionalized polybutadienes such as polybutadiene diacrylates and polybutadiene dimethacrylates. These materials are sold under the trade names RICACRYL 3100, RICACRYL 3500, and RICACRYL 3801. Also are included are powder dispersions of functional polybutadiene derivatives including, for example, RICON 150D, 152D, 153D, 154D, P30D, RICOBOND 1731 HS, and RICOBOND 1756 HS. Further butadiene resins include poly(butadiene-isoprene) block and random copolymers, such as those with number average molecular weights of about 3,000 to about 50,000 atomic mass units and polybutadiene homopolymers having number average molecular weights of about 3,000 to about 50,000 atomic mass units. Also included are polybutadiene, polyisoprene, and polybutadiene-isoprene copolymers functionalized with maleic anhydride, 2-hydroxyethylmaleic acid, or hydroxylated functionality.

Further examples of oligomers and polymers with curable vinyl functionality include the unsaturated polyester resins based on maleic anhydride, fumaric acid, itaconic acid and citraconic acid, unsaturated epoxy acrylate resin based on acryloyl group, methacryloyl group and allyl group, urethane acrylate resin, polyether acrylate resin, polyalcohol acrylate resin, alkyd acrylate resin, polyester acrylate resin, spiroacetal acrylate resin, diallyl phthalate resin, diallyl tetrabromophthalate resin, diethyleneglycol bisallylcarbonate resin, and polyethylene polythiol resin.

In some embodiments, the vinyl thermoset resin is triallyl cyanurate (CAS Reg. No. 101-37-1), triallyl isocyanurate (CAS Reg. No. 1025-15-6), or a combination thereof. In some embodiments, the vinyl thermoset resin is triallyl isocyanurate.

In addition to the functionalized poly(arylene ether) and the vinyl thermoset resin, the curable composition comprises a flame retardant composition comprising a trihydrocarbylphosphine oxide and a nitrogen-containing flame retardant selected from the group consisting of melamine phosphate, melamine pyrophosphate, melamine polyphosphates, and mixtures thereof. Suitable trihydrocarbylphosphine oxides include those having the structure

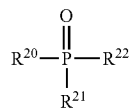

wherein $R^{20}$, $R^{21}$, and $R^{22}$ are each independently $C_1$-$C_{12}$ hydrocarbyl, with the proviso that the trihydrocarbylphosphine oxide has at least six carbon atoms. In some embodiments, at least one of $R^{20}$, $R^{21}$, and $R^{22}$ comprises an aliphatic carbon-carbon double bond or triple bond. In some embodiments, at least one of $R^{20}$, $R^{21}$, and $R^{22}$ is an aryl group. In some embodiments, $R^{20}$, $R^{21}$, and $R^{22}$ are all aryl groups. Suitable trihydrocarbylphosphine oxides include, for example, triphenylphosphine oxide, allyldiphenylphosphine oxide, diallylphenylphosphine oxide, triallylphosphine oxide, bis(1-naphthyl)(4-hydroxyphenyl)phosphine oxide, bis(4-hydroxyphenyl)(1-naphthyl)phosphine oxide, tris(4-hydroxyphenyl)phosphine oxide, tris(1-naphthyl)phosphine oxide, tris(2-naphthyl)phosphine oxide, bis(4-phenoxyphenyl)(4-hydroxyphenyl)phosphine oxide, bis(4-hydroxyphenyl)(4-phenoxyphenyl)phosphine oxide, tris(4-phenoxyphenyl)phosphine oxide, bis(2,4,5-trimethylphenyl)(4-hydroxyphenyl)phosphine oxide, bis(4-hydroxyphenyl)(2,4,5-trimethylphenyl)phosphine oxide, tris(2,4,5-trimethylphenyl)phosphine oxide, bis(tert-butyl)(4-hydroxyphenyl)phosphine oxide, bis(4-hydroxy-phenyl)(tert-butyl)phosphine oxide, tris(tert-butyl)phosphine oxide, and the like, and combinations thereof. In some embodiments, the trihydrocarbylphosphine oxide is triphenylphosphine oxide.

The composition comprises a nitrogen-containing flame retardant selected from the group consisting of melamine phosphate, melamine pyrophosphate, melamine polyphosphates, and mixtures thereof. These nitrogen-containing flame retardants may collectively be represented by the formula

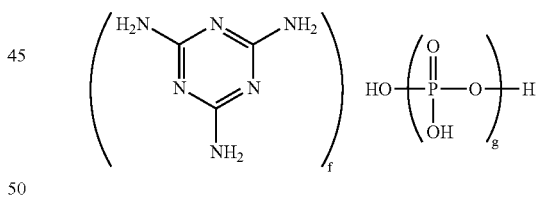

wherein g is 1 to about 10,000 and the ratio of f to g is about 0.5:1 to about 1.7:1, specifically 0.7:1 to 1.3:1, more specifically 0.9:1 to 1.1:1. It will be understood that this formula includes species in which one or more protons are transferred from the polyphosphate group to the melamine group(s). When g is 1, the nitrogen-containing flame retardant is melamine phosphate (CAS Reg. No. 20208-95-1). When g is 2, the nitrogen-containing flame retardant is melamine pyrophosphate (CAS Reg. No. 15541-60-3). When g is, on average, greater than 2, the nitrogen-containing flame retardant is melamine polyphosphate (CAS Reg. No. 56386-64-2). In some embodiments, the nitrogen-containing flame retardant is melamine pyrophosphate, melamine polyphosphate, or a mixture thereof. In some embodiments in which the nitrogen-containing flame retardant is melamine polyphosphate, g has an average value of greater than 2 to about 10,000, specifically about 5 to about 1,000, more specifically about 10 to about 500. In some embodiments in which the nitrogen-containing flame retardant is melamine polyphosphate, g has an average value of greater than 2 to about 500. Methods for preparing melamine phosphate, melamine pyrophosphate, and melamine polyphosphate are known in the art, and all are commercially available. For example, melamine polyphosphates may be prepared by reacting polyphosphoric acid and melamine, as described, for example, in U.S. Pat. No. 6,025,419 to Kasowski et al., or by heating melamine pyrophosphate under nitrogen at 290° C. to constant weight, as described in International Patent Application No. WO 98/08898 A1 to Jacobson et al.

The nitrogen-containing flame retardant may have a low volatility relative to temperatures used to thermally cure the curable composition. For example, in some embodiments, the nitrogen-containing flame retardant exhibits less than 1 percent weight loss by thermogravimetric analysis when heated at a rate of 20° C. per minute from 25 to 280° C., specifically 25 to 300° C., more specifically 25 to 320° C.

The components of the curable composition may be mixed in a wide range of amounts. For example, in some embodiments, the curable composition comprises about 5 to about 70 parts by weight of the functionalized poly(arylene ether); about 30 to about 95 parts by weight of the vinyl thermoset resin; and about 5 to about 50 parts by weight a flame retardant composition comprising about 2 to about 48 parts by weight of the trihydrocarbylphosphine oxide, and about 2 to about 48 parts by weight of the nitrogen-containing flame retardant, wherein all parts by weight are based on 100 parts by weight total of the functionalized poly(arylene ether) and vinyl thermoset resin. Within the above range of 5 to 70 parts by weight, the amount of functionalized poly(arylene ether) may be about 10 to about 60 parts by weight. Within the above range of about 30 to about 95 parts by weight, the vinyl thermoset resin amount may be about 40 to about 90 parts by weight. Within the above range of about 5 to about 50 parts by weight, the flame retardant composition amount may be about 10 to about 40 parts by weight, specifically about 15 to about 30 parts by weight. Within the above range of about 2 to about 48 parts by weight, the trihydrocarbylphosphine oxide amount may be about 5 to about 30 parts by weight, specifically about 10 to about 20 parts by weight, more specifically about 10 to about 15 parts by weight. Within the above range of about 2 to about 48 parts by weight, the nitrogen-containing flame retardant amount may be about 5 to about 30 parts by weight, specifically about 10 to about 25 parts by weight, more specifically about 10 to about 20 parts by weight, still more specifically about 10 to about 15 parts by weight.

In addition to the functionalized poly(arylene ether), the vinyl thermoset resin, and the flame retardant composition, the curable composition may, optionally, further comprise a curing initiator, a curing inhibitor, or a combination thereof. Non-limiting examples of curing initiators include those described in U.S. Pat. No. 5,407,972 to Smith et al., U.S. Pat. No. 5,218,030 to Katayose et al., and U.S. Pat. No. 7,067,595 to Zarnoch et al. The curing initiator may include any compound capable of producing free radicals at elevated temperatures. Such curing initiators may include both peroxy and non-peroxy based radical initiators. Examples of useful peroxy initiators include, for example, benzoyl peroxide, dicumyl peroxide, methyl ethyl ketone peroxide, lauryl peroxide, cyclohexanone peroxide, t-butyl hydroperoxide, t-butyl benzene hydroperoxide, t-butyl peroctoate, 2,5-dimethylhexane-2,5-dihydroperoxide, 2',5-dimethyl-2,5-di(t-butylperoxy)-hex-3-yne, di-t-butylperoxide, t-butylcumyl peroxide, alpha,alpha'-bis(t-butylperoxy-m-isopropyl)benzene, 2,5-dimethyl-2,5-di(t-butylperoxy)hexane, di(t-butylperoxy)isophthalate, t-butylperoxy benzoate, 2,2-bis(t-butylperoxy)butane, 2,2-bis(t-butylperoxy)octane, 2,5-dimethyl-2,5-di(benzoylperoxy)hexane, di(trimethylsilyl)peroxide, trimethylsilylphenyltriphenylsilyl peroxide, and the like, and mixtures thereof. Suitable non-peroxy initiators include, for example, 2,3-dimethyl-2,3-diphenylbutane, 2,3-trimethylsilyloxy-2,3-diphenylbutane, and the like, and mixtures thereof. The curing initiator may further include any compound capable of initiating anionic polymerization of the unsaturated components. Such anionic polymerization initiators include, for example, alkali metal amides such as sodium amide ($NaNH_2$) and lithium diethyl amide ($LiN(C_2H_5)_2$), alkali metal and ammonium salts of $C_1$-$C_{10}$ alkoxides, alkali metal hydroxides, ammonium hydroxides, alkali metal cyanides, organometallic compounds such as the alkyl lithium compound n-butyl lithium, Grignard reagents such as phenyl magnesium bromide, and the like, and combinations thereof. In a preferred embodiment, the curing initiator may comprise t-butylperoxy benzoate or dicumyl peroxide. The curing initiator may promote curing at a temperature in a range of about 0° C. to about 200° C. When employed, the curing initiator is typically used in an amount of about 0.005 to about 1 part by weight per 100 parts by weight total of functionalized poly (arylene ether) and the vinyl thermoset resin.

Suitable curing inhibitors include, for example, diazoaminobenzene, phenylacetylene, sym-trinitrobenzene, p-benzoquinone, acetaldehyde, aniline condensates, N,N'-dibutyl-o-phenylenediamine, N-butyl-p-aminophenol, 2,4,6-triphenylphenoxyl, pyrogallol, catechol, hydroquinone, monoalkylhydroquinones, p-methoxyphenol, t-butylhydroquinone, $C_1$-$C_6$-alkyl-substituted catechols (such as 4-tert-butylcatechol), dialkylhydroquinone, 2,4,6-dichloronitrophenol, halogen-ortho-nitrophenols, alkoxyhydroquinones, mono- and di- and polysulfides of phenols and catechols, thiols, oximes and hydrazones of quinone, phenothiazine, dialkylhydroxylamines, and the like, and combinations thereof. Suitable curing inhibitors further include poly (arylene ether)s having free hydroxyl groups. When present, the curing inhibitor amount may be about 0.001 to about 10 parts by weight per 100 parts by weight total of functionalized poly(arylene ether) and the vinyl thermoset resin.

The curable composition may, optionally, further comprise an inorganic filler. Suitable inorganic fillers include, for example, alumina, silica (including fused silica and crystalline silica), boron nitride (including spherical boron nitride), aluminum nitride, silicon nitride, magnesia, magnesium silicate, glass fibers, glass mat, and the like, and combinations thereof. When present, the inorganic filler may be used in an amount of about 2 to about 95 weight percent, based on the total weight of the curable composition. In some embodiments, the curable composition comprises less than 50 weight percent filler, or less than 30 weight percent filler, or less than 10 weight percent filler. In some embodiments, the curable composition is substantially free of inorganic filler (that is, the composition comprises less than 0.1 weight percent of inorganic filler added).

The composition may, optionally, further comprise one or more additives such as, for example, dyes, pigments, colorants, antioxidants, heat stabilizers, light stabilizers, plasticizers, lubricants, flow modifiers, drip retardants, antiblocking agents, antistatic agents, flow-promoting agents, processing aids, substrate adhesion agents, mold release agents, toughening agents, low-profile additives, stress-relief additives, and combinations thereof.

One embodiment is a curable composition, consisting of: a functionalized poly(arylene ether); a vinyl thermoset resin; a flame retardant composition consisting of a trihydrocarbylphosphine oxide and a nitrogen-containing flame retardant; optionally, a filler; optionally, a curing initiator, a curing inhibitor, or a combination thereof; and optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof.

One embodiment is a curable composition, comprising: a capped poly(arylene ether); triallyl cyanurate, triallyl isocyanurate, or a combination thereof; and a flame retardant composition comprising triphenylphosphine oxide and melamine polyphosphate.

One embodiment is a curable composition, consisting of: a capped poly(arylene ether); triallyl cyanurate, triallyl isocyanurate, or a combination thereof; a flame retardant composition consisting of triphenylphosphine oxide and melamine polyphosphate; optionally, a filler; optionally, a curing initiator, a curing inhibitor, or a combination thereof; and optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof.

One embodiment is a curable composition, comprising: about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.; about 40 to about 90 parts by weight of triallyl isocyanurate; and about 5 to about 40 parts by weight a flame retardant composition comprising about 2 to about 38 parts by weight triphenylphosphine oxide, and about 2 to about 38 parts by weight of melamine polyphosphate; wherein all parts by weight are based on 100 parts by weight total of the methacrylate-capped poly(2,6-dimethyl-1,4-phenylene ether) resin and the triallyl isocyanurate.

One embodiment is a curable composition, consisting of: about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.; about 40 to about 90 parts by weight of triallyl isocyanurate; and about 5 to about 40 parts by weight a flame retardant composition consisting of about 2 to about 38 parts by weight triphenylphosphine oxide, and about 2 to about 38 parts by weight of melamine polyphosphate; optionally, up to 900 parts by weight of a filler; optionally, a curing initiator, a curing inhibitor, or a combination thereof; and optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the methacrylate-capped poly(2,6-dimethyl-1,4-phenylene ether) resin and the triallyl isocyanurate.

One embodiment is a curable composition, comprising: about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.; about 40 to about 90 parts by weight of triallyl isocyanurate; and about 15 to about 30 parts by weight a flame retardant composition comprising about 2 to about 28 parts by weight triphenylphosphine oxide, and about 2 to about 28 parts by weight of melamine polyphosphate; wherein all parts by weight are based on 100 parts by weight total of the methacrylate-capped poly(2,6-dimethyl-1,4-phenylene ether) resin and the triallyl isocyanurate.

One embodiment is a curable composition, consisting of: about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.; about 40 to about 90 parts by weight of triallyl isocyanurate; and about 15 to about 30 parts by weight a flame retardant composition consisting of about 2 to about 28 parts by weight triphenylphosphine oxide, and about 2 to about 28 parts by weight of melamine polyphosphate; optionally, up to 900 parts by weight of a filler; optionally, a curing initiator, a curing inhibitor, or a combination thereof; and optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof; wherein all parts by weight are based on 100 parts by weight total of the methacrylate-capped poly(2,6-dimethyl-1,4-phenylene ether) resin and the triallyl isocyanurate.

Another embodiment is a method of preparing a curable composition, comprising: blending a functionalized poly(arylene ether), a vinyl thermoset resin, and a flame retardant composition comprising a trihydrocarbylphosphine oxide and a nitrogen-containing flame retardant selected from the group consisting of melamine phosphate, melamine pyrophosphate, melamine polyphosphates, and mixtures thereof.

Other embodiments include cured compositions obtained on curing any of the curable compositions described above. There is no particular limitation on the method by which the composition may be cured. The composition may, for example, be cured thermally or by using irradiation techniques, including radio frequency heating, UV irradiation, and electron beam irradiation. For example, the composition may be cured by initiating chain-reaction curing with 10 seconds of radio frequency heating. When heat curing is used, the temperature selected may be about 80° to about 300° C., and the heating period may be about 5 seconds to about 24 hours. Curing may be conducted in multiple steps using different times and temperatures for each step. For example, curing may be staged to produce a partially cured and often tack-free resin, which then is fully cured by heating for longer periods or at higher temperatures. One skilled in the thermoset arts is capable of determining suitable curing conditions without undue experimentation. In some embodiments, the composition may be partially cured. However, references herein to properties of the "cured composition" or the "composition after curing" generally refer to compositions that are substantially fully cured. One skilled in the thermoplastic arts may determine whether a sample is substantially fully cured without undue experimentation. For example, one may analyze the sample by differential scanning calorimetry to look for an exotherm indicative of additional curing occurring during the analysis. A sample that is substantially fully cured will exhibit little or no exotherm in such an analysis.

The cured composition is highly flame retardant relative to the amount of the flame retardant composition employed. In some embodiments, the cured composition exhibits a V-0 rating for the Vertical Burning Flame Test of Underwriters Laboratories Standard UL 94, "Test for Flammability of Plastic Materials for Parts in Devices and Appliances", 5th Edition, Oct. 29, 1996. The requirements for a V-0 rating include no individual burn times greater than 10 seconds, the combined first and second burn times for each bar are not greater then 10 seconds, and no ignition of cotton indicator by flaming particles or drips.

The invention includes articles comprising the partially or fully cured composition. The flame resistance, impact resistance, and excellent dielectric properties of the composition make it particularly useful for fabricating electronic components. For example, the curable composition may be used to form prepregs that in turn can be used to form circuit boards. The compositions described herein are also useful in the manufacture of syntactic foams such as those used as insulation materials and various fiber reinforcing applications such as bulk molding compounds and sheet molding compounds.

The invention is further illustrated by the following non-limiting examples.

EXAMPLES 1-4, COMPARATIVE EXAMPLES 1-8

The following examples illustrate the advantageous flame retarding action provided by the combination of a trihydrocarbylphosphine oxide and a nitrogen-containing flame retardant.

All flame retardant compositions were tested with the thermoset resin composition presented in Table 1, where all component amounts are expressed in parts by weight (pbw). Triallyl isocyanurate inhibited with 500 parts per million by weight tert-butylhydroquinone was obtained from Degussa Corporation. The poly(arylene ether) was a methacrylate-capped poly(2,6-dimethyl-1,4-phenylene ether) having an intrinsic viscosity of about 0.12 deciliter per gram as measured at 25° C. in chloroform, obtained as PPO* SA5587-111 from GE Plastics. Glass fiber having a diameter of about 14 micrometers and an initial length of about 4 millimeters, obtained as 497-14C from Owens-Corning. The peroxide curing promoter, 2,5-bis(tert-butylperoxy)-2,5-dimethylhexane (CAS Reg. No. 78-63-7), was obtained as Trigonox 101 from Akzo-Nobel. The curing inhibitor, 4-tert-butylcatechol (CAS Reg. No. 98-29-3), was obtained from Sigma-Aldrich (catalog number 19671). The mold release, zinc stearate (CAS Reg. No. 557-05-1), was obtained from Sigma-Aldrich (catalog number 307564).

TABLE 1

| Component | Amount (pbw) |
| --- | --- |
| Triallyl isocyanurate | 47.5 |
| Poly(arylene ether) | 27.2 |
| Glass fiber | 25.3 |
| Curing promoter | 0.59 |
| Curing inhibitor | 0.11 |
| Zinc stearate | 0.55 |

In addition to the thermoset resin composition of Table 1, the curable compositions included melamine polyphosphate, triphenylphosphine oxide, or both at the concentrations specified in Table 2. The flame retardant concentrations are expressed in weight percent (wt %) based on the total weight of the composition. Melamine polyphosphate was obtained as Melapur 200 ("MPP"; CAS Reg. Nos. 56386-64-2 ("Phosphoric acid, polymer with 1,3,5-triazine-2,4,6-triamine") and 218768-84-4 ("Melapur 200" and "A flame retardant based on melamine polyphosphate")) from Ciba Specialty Chemicals. Triphenylphosphine oxide ("TPPO"; CAS Reg. No. 791-28-6) was obtained from Sigma-Aldrich (catalog number T84603).

Curable compositions were prepared by heating at 90-95° C. a mixture of methacrylate-capped poly(arylene ether), triallyl isocyanurate and t-butyl catechol until the poly(arylene ether) was dissolved. Next, the melamine polyphosphate and/or triphenylphosphine oxide were added and mixed while maintaining the temperature at 90-95° C. Then the chopped glass fiber was added and mixed while maintaining the temperature at 90-95° C. Finally the peroxide was added, and quickly mixed. The curable compositions were molded by transferring into a 254 millimeters×254 millimeters×3.175 millimeters (10 inches×10 inches×0.125 inches) mold, which was preheated to 100° C. and placed in an oven at 100° C. for 15-18 hours. Then the temperature was increased in steps: one hour at 110° C., two hours at 125° C., one hour at 150° C., and ten minutes at 175° C. The oven was turned off and the mold was allowed to cool to ambient temperature overnight. The cured plaque was removed from the mold and cut into test articles having dimensions 127 millimeters×12.7 millimeters×3.175 millimeters (5 inches×0.5 inches×0.125 inches) using a tile cutting saw with a diamond cutting blade.

The flame retardancy of test articles was determined according to Underwriter's Laboratory UL 94, "Test for Flammability of Plastic Materials for Parts in Devices and Appliances", 5th Edition (1996), Vertical Burning Flame Test. In this procedure, the test bar is mounted vertically. A 1.9 centimeter (0.75 inch) flame is applied to the end of the test bar for 10 seconds and removed. The time to extinguish is measured (first burn time). The flame is reapplied for another 10 seconds and removed. The time to extinguish is measured (second burn time). The average burn times presented in Table 2 represent the average of the first and second burn times for five samples. Average burn times are expressed in seconds (s).

The results for Comparative Example 1 in Table 2 show that a composition without any added flame retardant had an average burn time of 225.4 seconds. Comparative Examples 2-5 represent increasing concentrations of melamine polyphosphate. Although average burn times decrease with increasing concentrations of melamine polyphosphate, the only sample exhibiting a burn time less than 10 seconds contained 25 weight percent of melamine polyphosphate. Comparative Examples 6-8 represent increasing concentrations of triphenylphosphine oxide. Again, average burn times decrease with increasing concentrations of the flame retardant, but all the average times are quite long: from 91.08 to 162.45 seconds. Note that the desirable UL 94 V-0 rating requires no individual burn times greater than 10 seconds. Examples 1-4 represent combinations of melamine polyphosphate and triphenylphosphine oxide. Very low burn out times of 1.8 to 10.64 seconds are observed for these samples. The results show that there is an advantage to the combination of the melamine polyphosphate and triphenylphosphine oxide relative to the use of either alone.

COMPARATIVE EXAMPLES 9-16

These comparative examples demonstrate that, in contrast to the advantage demonstrated for the combination of a trihydrocarbylphosphine oxide with a melamine phosphate/pyrophosphate/polyphosphate, there is no significant advantage observed for the combination of a trihydrocarbylphosphine oxide with a melamine cyanurate.

Melamine cyanurate (CAS Reg. No. 37640-57-6) was obtained as Bundit 315 from Chemische Fabrik Budenheim. The resin system in which flame retardants were tested is the same as that specified in Table 1, above. Flame retardancy results for all flame retardant variations are presented in Table 3. The data for no flame retardant and triphenylphosphine oxide alone are the same as those presented in Table 2.

The results show that melamine cyanurate by itself, is a much less effective flame retardant than melamine polyphosphate by itself (see Comparative Examples 1 and 10-12 from Table 3 versus Comparative Examples 1-5 in Table 2). The results also show that the combinations of melamine cyanurate and triphenylphosphine oxide did not produce an average burn time less than 85 seconds.

TABLE 2

|  | C. Ex. 1 | C. Ex. 2 | C. Ex. 3 | C. Ex. 4 | C. Ex. 5 | C. Ex. 6 | C. Ex. 7 | C. Ex. 8 | Ex. 1 | Ex. 2 | Ex. 3 | Ex. 4 |
|---|---|---|---|---|---|---|---|---|---|---|---|---|
| Melamine polyphosphate (wt %) | 0 | 6.13 | 11.11 | 17.65 | 25.00 | 0 | 0 | 0 | 11.76 | 12.12 | 12.50 | 12.82 |
| Triphenylphosphine oxide (wt %) | 0 | 0 | 0 | 0 | 0 | 2.56 | 5.26 | 11.11 | 5.88 | 9.09 | 12.50 | 15.38 |
| MPP/TPPO | — | — | — | — | — | — | — | — | 2.0 | 1.3 | 1.0 | 0.8 |
| Average burn time (s) | 225.4 | 185.62 | 116.88 | 43.34 | 8.34 | 162.48 | 131.44 | 91.08 | 10.64 | 2.42 | 2.16 | 1.80 |

TABLE 3

|  | C. Ex. 1 | C. Ex. 6 | C. Ex. 7 | C. Ex. 8 | C. Ex. 9 | C. Ex. 10 | C. Ex. 11 | C. Ex. 12 | C. Ex. 13 | C. Ex. 14 | C. Ex. 15 | C. Ex. 16 |
|---|---|---|---|---|---|---|---|---|---|---|---|---|
| Melamine cyanurate (wt %) | 0 | 0 | 0 | 0 | 6.77 | 13.5 | 20.3 | 27.07 | 4.04 | 7.82 | 11.36 | 14.66 |
| Triphenylphosphine oxide (wt %) | 0 | 2.56 | 5.26 | 11.11 | 0 | 0 | 0 | 0 | 4.04 | 5.86 | 7.57 | 8.80 |
| Average burn time (s) | 225.4 | 162.48 | 131.44 | 91.08 | 220.8 | 215.4 | 207.5 | 195.7 | 142.0 | 122.8 | 99.6 | 85.5 |

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, of if they include equivalent structural elements with insubstantial differences from the literal language of the claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other.

The use of the terms "a" and "an" and "the" and similar referents in the context of describing the invention (especially in the context of the following claims) are to be construed to cover both the singular and the plural, unless otherwise indicated herein or clearly contradicted by context. Further, it should be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A curable composition, comprising:
   a functionalized poly(arylene ether);
   a vinyl thermoset; and
   a flame retardant composition consisting of a trihydrocarbylphosphine oxide and a nitrogen-containing flame retardant selected from the group consisting of melamine phosphate, melamine pyrophosphate, melamine polyphosphates, and mixtures thereof.

2. The curable composition of claim 1, wherein the functionalized poly(arylene ether) is a capped poly(arylene ether) having the structure

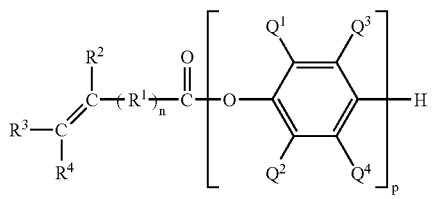

wherein each occurrence of $Q^1$ and $Q^2$ is independently halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; each occurrence of $Q^3$ and $Q^4$ is independently hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; p is 1 to about 100; $R^1$ is $C_1$-$C_{12}$ hydrocarbylene; n is 0 or 1; and $R^2$ and $R^3$ and $R^4$ are each independently hydrogen or $C_1$-$C_{18}$ hydrocarbyl; wherein the capped poly(arylene ether) has an intrinsic viscosity of about 0.03 to about 0.20 deciliter per gram, measured at 25° C. in chloroform.

3. The curable composition of claim 1, wherein the functionalized poly(arylene ether) is a capped poly(arylene ether) having the structure

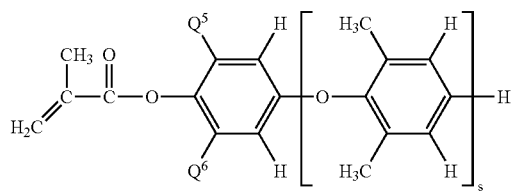

wherein $Q^5$ and $Q^6$ are each independently methyl or di-n-butylaminomethyl; s is 1 to about 20; and the capped poly(arylene ether) has an intrinsic viscosity of about 0.03 to about 0.20 deciliter per gram, measured at 25° C. in chloroform.

4. The curable composition of claim 1, wherein the functionalized poly(arylene ether) is a capped poly(arylene ether) having the structure dently $C_1$-$C_{12}$ hydrocarbylene; each occurrence of n is independently 0 or 1; each occurrence of $R^2$-$R^4$ is independently hydrogen or $C_1$-$C_{18}$ hydrocarbyl; and L has the structure

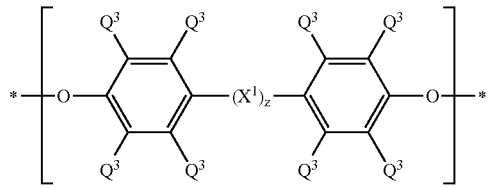

wherein each occurrence of $Q^3$ is independently hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; z is 0 or 1; and $X^1$ has a structure selected from the group consisting of

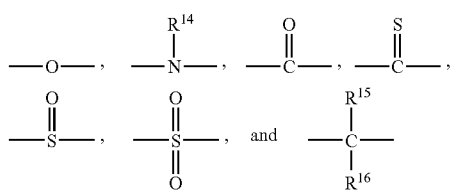

wherein each occurrence of $R^{14}$ is independently selected from the group consisting of hydrogen and $C_1$-$C_{12}$ hydrocar-

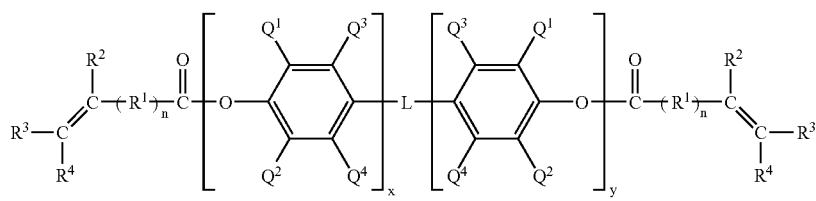

wherein each occurrence of $Q^1$ and $Q^2$ is independently halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; each occurrence of $Q^3$ and $Q^4$ is independently hydrogen, halogen, unsubstituted or substituted $C_1$-$C_{12}$ hydrocarbyl with the proviso that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; each occurrence of x and y is independently 0 to about 100 with the proviso that the sum of x and y is 2 to about 100; each occurrence of $R^1$ is indepenbyl and each occurrence of $R^{15}$ and $R^{16}$ is independently selected from the group consisting of hydrogen, $C_1$-$C_{12}$ hydrocarbyl, and $C_1$-$C_6$ hydrocarbylene wherein $R^{15}$ and $R^{16}$ collectively form a $C_4$-$C_{12}$ alkylene group; wherein the capped poly(arylene ether) has an intrinsic viscosity of about 0.03 to about 0.20 deciliter per gram, specifically about 0.06 to about 0.15 deciliter per gram, more specifically about 0.06 to about 0.12 deciliter per gram, even more specifically about 0.06 to about 0.09 deciliter per gram, measured at 25° C. in chloroform.

5. The curable composition of claim 1, wherein the functionalized poly(arylene ether) is a capped poly(arylene ether) having the structure

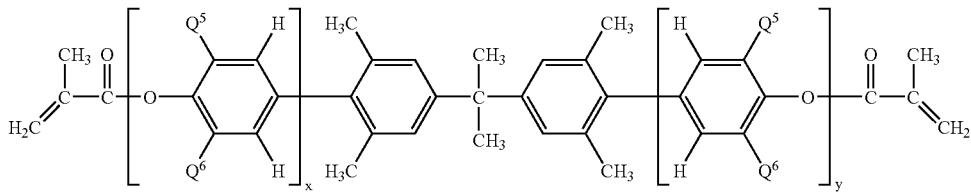

wherein each occurrence of $Q^5$ and $Q^6$ is independently methyl or di-n-butylaminomethyl; each occurrence of x and y is independently 0 to about 100 with the proviso that the sum of x and y is 2 to about 100.

6. The curable composition of claim 1, wherein the functionalized poly(arylene ether) is a capped poly(arylene ether) having the structure

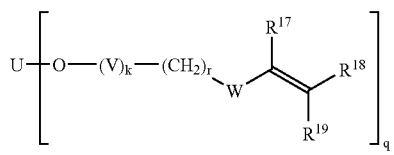

wherein U is a $C_6$-$C_{18}$ aryl group optionally substituted with one or more $C_1$-$C_6$ alkyl groups; V is a phenylene ether group; k is 1 to about 100; r is 1 to 6; W is a phenylene group or an oxygen atom; each occurrence of $R^{17}$, $R^{18}$, and $R^{19}$ is independently selected from the group consisting of hydrogen, $C_1$-$C_6$ alkyl, $C_2$-$C_6$ alkenyl, and $C_2$-$C_6$ alkynyl; and q is 1, 2, 3, or 4.

7. The curable composition of claim 1, wherein the functionalized poly(arylene ether) is a ring-functionalized poly (arylene ether) comprising repeating structural units of the formula

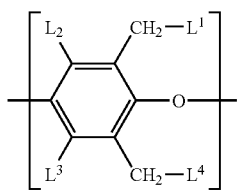

wherein each $L^1$-$L^4$ is independently hydrogen, a $C_1$-$C_{12}$ alkyl group, an alkenyl group, or an alkynyl group; wherein the alkenyl group is represented by

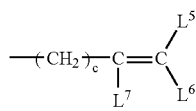

wherein $L^5$, $L^6$, and $L^7$ are each independently hydrogen or methyl, and c is 0, 1, 2, 3, or 4; wherein the alkynyl group is represented by

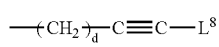

wherein $L^8$ is hydrogen, methyl, or ethyl, and d is 0, 1, 2, 3, or 4; and wherein about 0.02 mole percent to about 25 mole percent of the total $L^1$-$L^4$ substituents in the ring-functionalized poly(arylene ether) are alkenyl and/or alkynyl groups.

8. The curable composition of claim 1, wherein the vinyl thermoset is selected from the group consisting of maleimide resins, benzoxazine resins, vinylbenzyl ether resins, alkene-containing monomers alkyne-containing monomers, arylcyclobutene resins, perfluorovinyl ether resins, oligomers and polymers with curable vinyl functionality, and combinations thereof.

9. The curable composition of claim 1, wherein the vinyl thermoset is triallyl cyanurate, triallyl isocyanurate, or a combination thereof.

10. The curable composition of claim 1, wherein the vinyl thermoset is triallyl isocyanurate.

11. The curable composition of claim 1, wherein the trihydrocarbylphosphine oxide has the structure

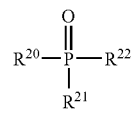

wherein $R^{20}$, $R^{21}$, and $R^{22}$ are each independently $C_1$-$C_{12}$ hydrocarbyl, with the proviso that the trihydrocarbylphosphine oxide has at least six carbon atoms.

12. The curable composition of claim 1, wherein the trihydrocarbylphosphine oxide is selected from the group consisting of triphenylphosphine oxide, allyldiphenylphosphine oxide, diallylphenylphosphine oxide, triallylphosphine oxide, bis(1-naphthyl)(4-hydroxyphenyl)phosphine oxide, bis(4-hydroxyphenyl)(1-naphthyl)phosphine oxide, tris(4-hydroxyphenyl)phosphine oxide, tris(1-naphthyl)phosphine oxide, tris(2-naphthyl)phosphine oxide, bis(4-phenoxyphenyl)(4-hydroxyphenyl)phosphine oxide, bis(4-hydroxyphenyl)(4-phenoxyphenyl)phosphine oxide, tris(4-phenoxyphenyl)phosphine oxide, bis(2,4,5-trimethylphenyl)(4-hydroxyphenyl)phosphine oxide, bis(4-hydroxyphenyl)(2,4,5-trimethylphenyl)phosphine oxide, tris(2,4,5-trimethylphenyl)phosphine oxide, bis(tert-butyl)(4-hydroxyphenyl)phosphine oxide, bis(4-hydroxy-phenyl)(tert-butyl)phosphine oxide, tris(tert-butyl)phosphine oxide, and the like, and combinations thereof.

13. The curable composition of claim 1, wherein the trihydrocarbylphosphine oxide is triphenylphosphine oxide.

14. The curable composition of claim 1, wherein the nitrogen-containing flame retardant is melamine pyrophosphate, melamine polyphosphate or a mixture thereof.

15. The curable composition of claim 1, wherein the nitrogen-containing flame retardant is a melamine polyphosphate.

16. The curable composition of claim 1, wherein the nitrogen-containing flame retardant is a melamine polyphosphate represented by the formula

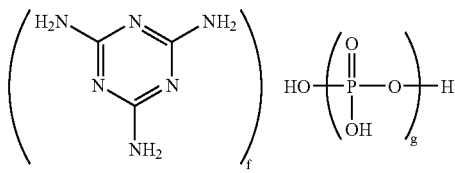

wherein g has an average value of greater than 2 to about 500; and the ratio of f to g is about 0.5:1 to about 1.7:1.

17. The curable composition of claim 1, wherein the nitrogen-containing flame retardant exhibits less than 1 percent weight loss by thermogravimetric analysis when heated from 25° C. to 280° C. at a rate of 20° C. per minute.

18. The curable composition of claim 1, comprising
about 5 to about 70 parts by weight of the functionalized poly(arylene ether);
about 30 to about 95 parts by weight of the vinyl thermoset; and
about 5 to about 50 parts by weight a flame retardant composition consisting of about 2 to about 48 parts by weight triphenylphosphine oxide, and about 2 to about 48 parts by weight of melamine polyphosphate;
wherein all parts by weight are based on 100 parts by weight total of the functionalized poly(arylene ether) and the vinyl thermoset.

19. A curable composition, consisting of:
a functionalized poly(arylene ether);
a vinyl thermoset;
a flame retardant composition consisting of a trihydrocarbylphosphine oxide and a nitrogen-containing flame retardant;
optionally, a filler;
optionally, a curing initiator, a curing inhibitor, or a combination thereof; and
optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof.

20. A curable composition, comprising:
a capped poly(arylene ether);
triallyl cyanurate, triallyl isocyanurate, or a combination thereof; and
a flame retardant composition consisting of triphenylphosphine oxide and melamine polyphosphate.

21. A curable composition, consisting of:
a capped poly(arylene ether);
triallyl cyanurate, triallyl isocyanurate, or a combination thereof;
a flame retardant composition consisting of triphenylphosphine oxide and melamine polyphosphate;
optionally, a filler;
optionally, a curing initiator, a curing inhibitor, or a combination thereof; and
optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof.

22. A curable composition, comprising:
about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.;
about 40 to about 90 parts by weight of triallyl isocyanurate; and
about 10 to about 40 parts by weight a flame retardant composition consisting of about 2 to about 38 parts by weight triphenylphosphine oxide, and about 2 to about 38 parts by weight of melamine polyphosphate;
wherein all parts by weight are based on 100 parts by weight total of the methacrylate-capped poly(2,6-dimethyl-1,4-phenylene ether) resin and the triallyl isocyanurate.

23. A curable composition, consisting of:
about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.;
about 40 to about 90 parts by weight of triallyl isocyanurate; and
about 10 to about 40 parts by weight a flame retardant composition consisting of about 2 to about 38 parts by weight triphenylphosphine oxide, and about 2 to about 38 parts by weight of melamine polyphosphate;
optionally, up to 900 parts by weight of a filler;
optionally, a curing initiator, a curing inhibitor, or a combination thereof; and
optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof;
wherein all parts by weight are based on 100 parts by weight total of the methacrylate-capped poly(2,6-dimethyl-1,4-phenylene ether) resin and the triallyl isocyanurate.

24. A curable composition, comprising:
about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.;
about 40 to about 90 parts by weight of triallyl isocyanurate; and
about 15 to about 30 parts by weight a flame retardant composition consisting of about 2 to about 28 parts by weight triphenylphosphine oxide, and about 2 to about 28 parts by weight of melamine polyphosphate;
wherein all parts by weight are based on 100 parts by weight total of the methacrylate-capped poly(2,6-dimethyl-1,4-phenylene ether) resin and the triallyl isocyanurate.

25. A curable composition, consisting of:
about 10 to about 60 parts by weight of a methacrylate-capped poly(2,6-dimethyl-1,4-phenylene ether) resin having an intrinsic viscosity of about 0.03 to about 0.30 deciliter per gram, measured in chloroform at 25° C.;
about 40 to about 90 parts by weight of triallyl isocyanurate; and
about 15 to about 30 parts by weight a flame retardant composition consisting of about 2 to about 28 parts by weight triphenylphosphine oxide, and about 2 to about 28 parts by weight of melamine polyphosphate;

optionally, up to 900 parts by weight of a filler;

optionally, a curing initiator, a curing inhibitor, or a combination thereof; and optionally, an additive selected from the group consisting of dyes, pigments, colorants, antioxidants, heat stabilizers, light stabilizers, plasticizers, lubricants, flow modifiers, drip retardants, flame retardants, antiblocking agents, antistatic agents, flow-promoting agents, processing aids, substrate adhesion agents, mold release agents, toughening agents, low-profile additives, stress-relief additives, and combinations thereof;

wherein all parts by weight are based on 100 parts by weight total of the methacrylate-capped poly(2,6-dimethyl-1,4-phenylene ether) resin and the triallyl isocyanurate.

26. A method of preparing a curable composition, comprising:

blending a functionalized poly(arylene ether);

a vinyl thermoset; and a flame retardant composition consisting of a trihydrocarbylphosphine oxide and a nitrogen-containing flame retardant selected from the group consisting of melamine phosphate, melamine pyrophosphate, melamine polyphosphates, and mixtures thereof.

27. A cured composition, comprising a reaction product obtained on curing the curable composition of claim 1.

28. The cured composition of claim 27, exhibiting a UL 94 Vertical Burning Flame Test rating of V-0.

29. An article comprising the cured composition of claim 27.

30. A prepreg comprising the cured composition of claim 27.

31. A circuit board comprising the cured composition of claim 27.

32. A curable composition, comprising:

19.12 to 22.13 weight percent of a methacrylate-capped poly(2,6-dimethyl-1,4-phenylene ether) resin;

33.38 to 38.64 weight percent of triallyl isocyanurate;

17.78 to 20.58 weight percent of glass fibers; and a flame retardant composition consisting of 5.88 to 16.02 weight percent triphenylphosphine oxide, and 11.76 to 12.82 weight percent melamine polyphosphate;

wherein all weight percents are based on the total weight of the composition.

* * * * *